United States Patent
Lee

(10) Patent No.: US 11,955,090 B2
(45) Date of Patent: Apr. 9, 2024

(54) BUFFER CIRCUIT INCLUDING OFFSET BLOCKING CIRCUIT AND DISPLAY DEVICE INCLUDING THE SAME

(71) Applicant: Samsung Electronics Co., Ltd., Suwon-si (KR)

(72) Inventor: Sungho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/683,775

(22) Filed: Mar. 1, 2022

(65) Prior Publication Data
US 2022/0383823 A1 Dec. 1, 2022

(30) Foreign Application Priority Data

May 31, 2021 (KR) .................. 10-2021-0070193
Jul. 23, 2021 (KR) .................. 10-2021-0097187

(51) Int. Cl.
G09G 3/3275 (2016.01)
H03F 3/45 (2006.01)

(52) U.S. Cl.
CPC ....... G09G 3/3275 (2013.01); H03F 3/45269 (2013.01); G09G 2310/0243 (2013.01); G09G 2310/0291 (2013.01); G09G 2320/0204 (2013.01); G09G 2330/02 (2013.01)

(58) Field of Classification Search
CPC .................... G09G 3/3275; H03F 3/45269
See application file for complete search history.

(56) References Cited

U.S. PATENT DOCUMENTS

| | | |
|---|---|---|
| 7,081,792 B2 | 7/2006 | Kasai et al. |
| 7,106,136 B2 | 9/2006 | Moon et al. |
| 7,554,405 B2 | 6/2009 | Kim |
| 9,344,043 B2 | 5/2016 | Liu et al. |
| 9,530,356 B2 | 12/2016 | Min et al. |
| 9,543,912 B2 | 1/2017 | Lee |
| 9,577,619 B2 | 2/2017 | Kim et al. |
| 2014/0193164 A1* | 7/2014 | Ide ............... H04B 10/6933 398/210 |
| 2022/0200555 A1* | 6/2022 | Jeong .............. H03F 3/45192 |

FOREIGN PATENT DOCUMENTS

CN 103368502 * 10/2013

* cited by examiner

Primary Examiner — Nelson M Rosario
Assistant Examiner — Scott D Au
(74) Attorney, Agent, or Firm — Harness, Dickey & Pierce, P.L.C.

(57) ABSTRACT

A buffer circuit according to an aspect of the inventive concepts include an operational amplifier configured to amplify an input voltage to generate an output voltage; a slew-rate compensating circuit configured to generate a compensation current based on a difference between a voltage level of the input voltage and a voltage level of the output voltage, and configured to provide the compensation current to the operational amplifier through a boosting transistor; and an offset blocking circuit configured to turn off the boosting transistor when the difference between the voltage level of the input voltage and the voltage level of the output voltage is less than a reference voltage level by providing a blocking current to the slew-rate compensating circuit.

20 Claims, 18 Drawing Sheets

BUFFER CIRCUIT INCLUDING OFFSET BLOCKING CIRCUIT AND DISPLAY DEVICE INCLUDING THE SAME

CROSS-REFERENCE TO RELATED APPLICATIONS

This application is based on and claims priority under 35 U.S.C. § 119 to Korean Patent Application Nos. 10-2021-0070193, filed on May 31, 2021 and 10-2021-0097187, filed on Jul. 23, 2021, in the Korean Intellectual Property Office, the disclosures of which are incorporated by reference herein in their entirety.

BACKGROUND

The technical idea of the inventive concepts relates to a buffer circuit and a display device, and more particularly, to a buffer circuit and a display device including an offset blocking circuit.

Display devices used in an electronic device that displays an image such as a TV, a laptop computer, a monitor, and a mobile device may include liquid crystal display devices (LCDs), organic light emitting devices (OLEDs), and the like. An LCD is widely used as an information processing device because it is thinner and lighter than a cathode ray tube and has improved quality.

A display device may include a display panel having a plurality of pixels, and a display driver. The display driver may provide an electrical signal to the plurality of pixels, and an image may be realized by the electrical signal. Recently, various studies have been conducted to improve performance such as resolution and slew rate of display devices.

SUMMARY

A display device with a buffer circuit including a slew-rate compensating circuit and an offset blocking circuit may reduce or eliminate a DC offset and have an improved slew rate.

The inventive concepts are not limited to solutions to the technical problems mentioned above, and other technical problems and solutions will be clearly understood by those skilled in the art from the following description.

A buffer circuit according to an aspect of the inventive concepts may include an operational amplifier configured to amplify an input voltage to generate an output voltage; a slew-rate compensating circuit configured to generate a compensation current based on a difference between a voltage level of the input voltage and a voltage level of the output voltage, and configured to provide the compensation current to the operational amplifier through a boosting transistor; and an offset blocking circuit configured to turn off the boosting transistor in response to the difference between the voltage level of the input voltage and the voltage level of the output voltage being less than a reference voltage level by providing a blocking current to the slew-rate compensating circuit.

A display device according to an aspect of the inventive concepts may include a display panel including a plurality of pixels formed at intersections of gate lines arranged in a row direction and source lines arranged in a column direction; a controller configured to generate a source control signal based on control signals received from the outside and convert image data received from the outside; and a source driver configured to convert the image data converted by the controller into an image signal in response to a source control signal received from the controller, and provide the image signal to the source lines, wherein the source driver may include an operational amplifier configured to amplify an input voltage to generate an output voltage; a slew-rate compensating circuit configured to generate a compensation current based on a difference between a voltage level of the input voltage and a voltage level of the output voltage and provide the compensation current to the operational amplifier through a boosting transistor; and a buffer circuit including an offset blocking circuit configured to turn off the boosting transistor in response to a difference between a voltage level of the input voltage and a voltage level of the output voltage being less than a reference voltage level by providing a blocking current to the slew-rate compensating circuit.

A method of controlling a buffer circuit according to an aspect of the inventive concepts may include comparing a difference between an input voltage level and an output voltage level of an operational amplifier with a reference voltage level in a slew-rate compensating circuit; generating a compensation current based on the difference between the input voltage level and the output voltage level in the slew-rate compensating circuit and providing the compensation current to the operational amplifier, in response to the difference between the input voltage level and the output voltage level being greater than the reference voltage level; and turning off a boosting transistor of the slew-rate compensating circuit by a blocking current that an offset blocking circuit provides to the slew-rate compensating circuit, in response to the difference between the input voltage level and the output voltage level being less than the reference voltage level.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
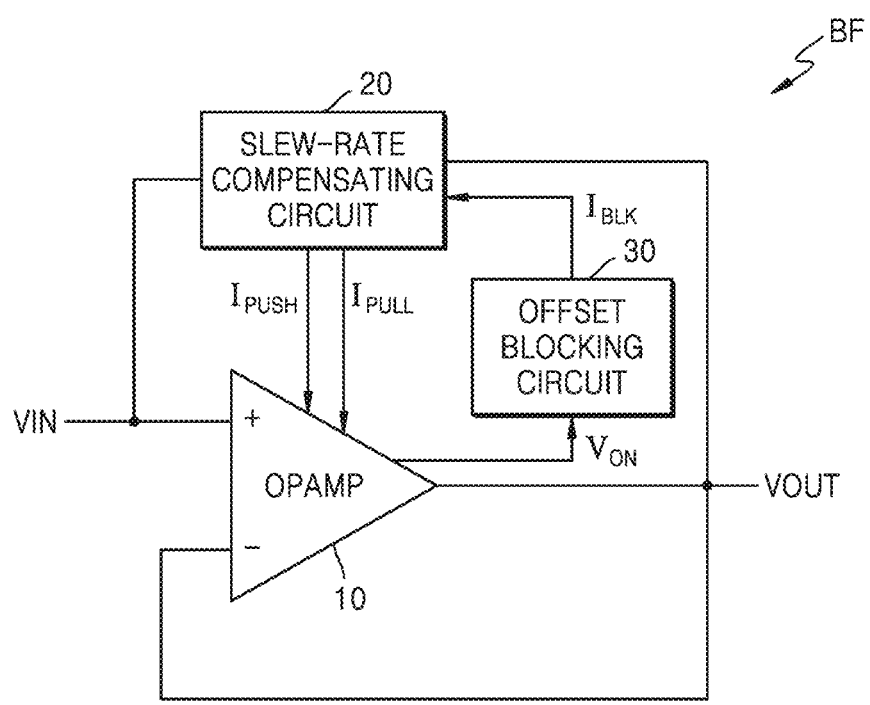
FIG. 1 is a block diagram of a buffer circuit according to example embodiments of the inventive concepts.

Hereinafter, various example embodiments of the inventive concepts are described with reference to the accompanying drawings. In the drawings of the present specification, for convenience of illustration, only a portion may be shown. When describing with reference to the drawings, the same or corresponding components are assigned the same reference numerals, and descriptions already given thereof are omitted.

FIG. 1 is a block diagram of a buffer circuit according to example embodiments of the inventive concepts.

Referring to FIG. 1, a buffer circuit BF may include an operational amplifier 10, a slew rate compensating circuit 20, and an offset blocking circuit 30.

The operational amplifier 10 may amplify a voltage level of an input voltage VIN and generate an output voltage VOUT. The output voltage VOUT of the operational amplifier 10 may be input to an inversion input stage of the operational amplifier 10 through a feedback loop. That is, the operational amplifier 10 may have a negative feedback structure in which the inverted input stage and the output stage are connected to each other. The operational amplifier 10 may have a rail-to-rail structure having a dual structure.

The slew-rate compensating circuit 20 may generate compensation currents IPUSH and IPULL based on a difference between the voltage level of the input voltage VIN and the voltage level of the output voltage VOUT. The slew-rate compensating circuit 20 may generate the compensation currents IPUSH and IPULL when the difference between the voltage level of the input voltage VIN and the voltage level of the output voltage VOUT is greater than a reference voltage level. The reference voltage level may include a voltage level of a threshold voltage of an n-channel field effect transistor (NFET) including the slew-rate compensating circuit 20 or a voltage level of a threshold voltage of a p-channel field effect transistor (PFET). The slew-rate compensating circuit 20 may provide compensation currents $I_{PUSH}$ and $I_{PULL}$ to the operational amplifier 10.

The offset blocking circuit 30 may generate a blocking current $I_{BLK}$ based on a turn-on voltage $V_{ON}$ provided from the operational amplifier 10, and may provide the blocking current $I_{BLK}$ to the slew-rate compensating circuit 20. The offset blocking circuit 30 may share a specific node with the operational amplifier 10. The offset blocking circuit 30 may receive the turn-on voltage $V_{ON}$ through the specific node. The voltage level of the turn-on voltage $V_{ON}$ may be equal to or greater than the threshold voltage level of transistors including the offset blocking circuit 30. The specific node may be described below as a 'push connection node' or a 'pull connection node', but is not limited thereto, and may correspond to any node capable of providing a voltage equal to or greater than the threshold voltage level of transistors including the offset blocking circuit 30 among the plurality of nodes of the operational amplifier 10.

The buffer circuit BF according to the present inventive concepts may include the offset blocking circuit 30 that provides the blocking current $I_{BLK}$ to the slew-rate compensating circuit 20, thereby reducing or eliminating DC offset and improving a slew rate.

Hereinafter, the components of the operational amplifier 10 and the relationship between the slew-rate compensating circuit 20 and the offset blocking circuit 30 is described in detail with reference to FIG. 2.

Figure 2:
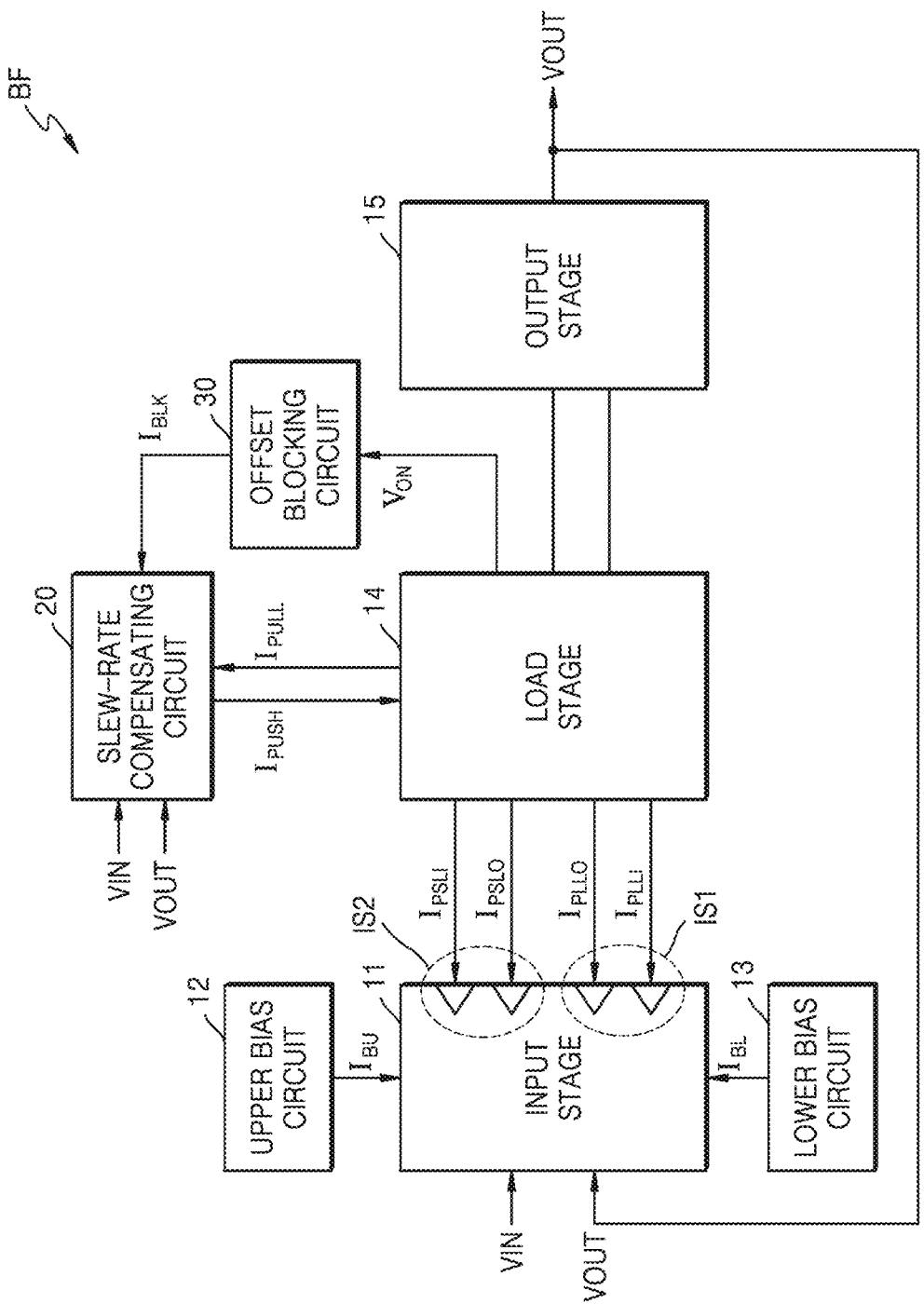
FIG. 2 is a block diagram of a buffer circuit according to example embodiments of the inventive concepts.

FIG. 2 is a block diagram of a buffer circuit according to example embodiments of the inventive concepts. In detail, FIG. 2 is a diagram for describing the operational amplifier 10 of FIG. 1 in detail.

Referring to FIG. 2, the operational amplifier 10 may include an input stage 11, an upper bias circuit 12, a lower bias circuit 13, a load stage 14 and an output stage 15.

The input stage 11 may receive an input voltage VIN and an output voltage VOUT. The output voltage VOUT may be input to the input stage 11 through a feedback loop. The input stage 11 may compare the voltage level of the input voltage VIN to the voltage level of the output voltage VOUT. The input stage 11 may include a first input terminal IS1 and a second input terminal IS2. The first input terminal IS1 may receive pulling load currents $I_{PLLI}$ and $I_{PLLO}$ from the load stage 14, and the second input terminal IS2 may receive pushing load currents $I_{PSLI}$ and $I_{PSLO}$.

The upper bias circuit 12 and the lower bias circuit 13 may provide a bias current necessary for driving the operational amplifier 10. The upper bias circuit 12 and the lower bias circuit 13 may provide bias currents $I_{BU}$ and $I_{BL}$ to the input stage 11.

The load stage 14 may receive compensation currents $I_{PUSH}$ and $I_{PULL}$ provided from the slew-rate compensating circuit 20. The load stage 14 may perform a slew rate compensation operation using the compensation currents $I_{PUSH}$ and $I_{PULL}$. The load stage 14 may generate load currents $I_{PSLI}, I_{PSLO}, I_{PPLI}$, and $I_{PLLO}$ based on a difference between the voltage level of the input voltage VIN and the voltage level of the output voltage VOUT. The load stage 14 may generate the load currents $I_{PSLI}, I_{PSLO}, I_{PLLI}$, and $I_{PLLO}$ by using the compensation currents $I_{PUSH}$ and $I_{PULL}$ The load stage 14 may provide the load currents $I_{PSLI}, I_{PSLO}, I_{PLLI}$, and $I_{PLLO}$ to the input stage 11.

The load stage 14 may provide the turn-on voltage $V_{ON}$ to the offset blocking circuit 30. The load stage 14 may share a specific node with the offset blocking circuit 30 and the output stage 15. The specific node may be described as a 'push connection node' and a 'pull connection node' with reference to FIG. 5 to be described later. However, the description of the specific node is not limited thereto, and the load stage 14 may share a node capable of providing a voltage level equal to or greater than the threshold voltage level of the transistors included in the offset blocking circuit 30 among the plurality of nodes of the load stage 14 with the offset blocking circuit 30.

The output stage 15 may be connected to the load stage 14. The output stage 15 may be connected to the load stage 14 through at least one of the 'push connection node' and the 'pull-linked node'. That is, the load stage 14, the output stage 15, and the offset blocking circuit 30 may share at least one of the 'push connection node' and the 'pull-connection node'. The output stage 15 may generate an output voltage by buffering an output signal of the load stage 14. The output stage 15 may output the output voltage to the outside of the buffer circuit BF.

Hereinafter, an operation of the buffer circuit BF is described in detail with reference to a circuit diagram of the buffer circuit BF.

Figure 3:
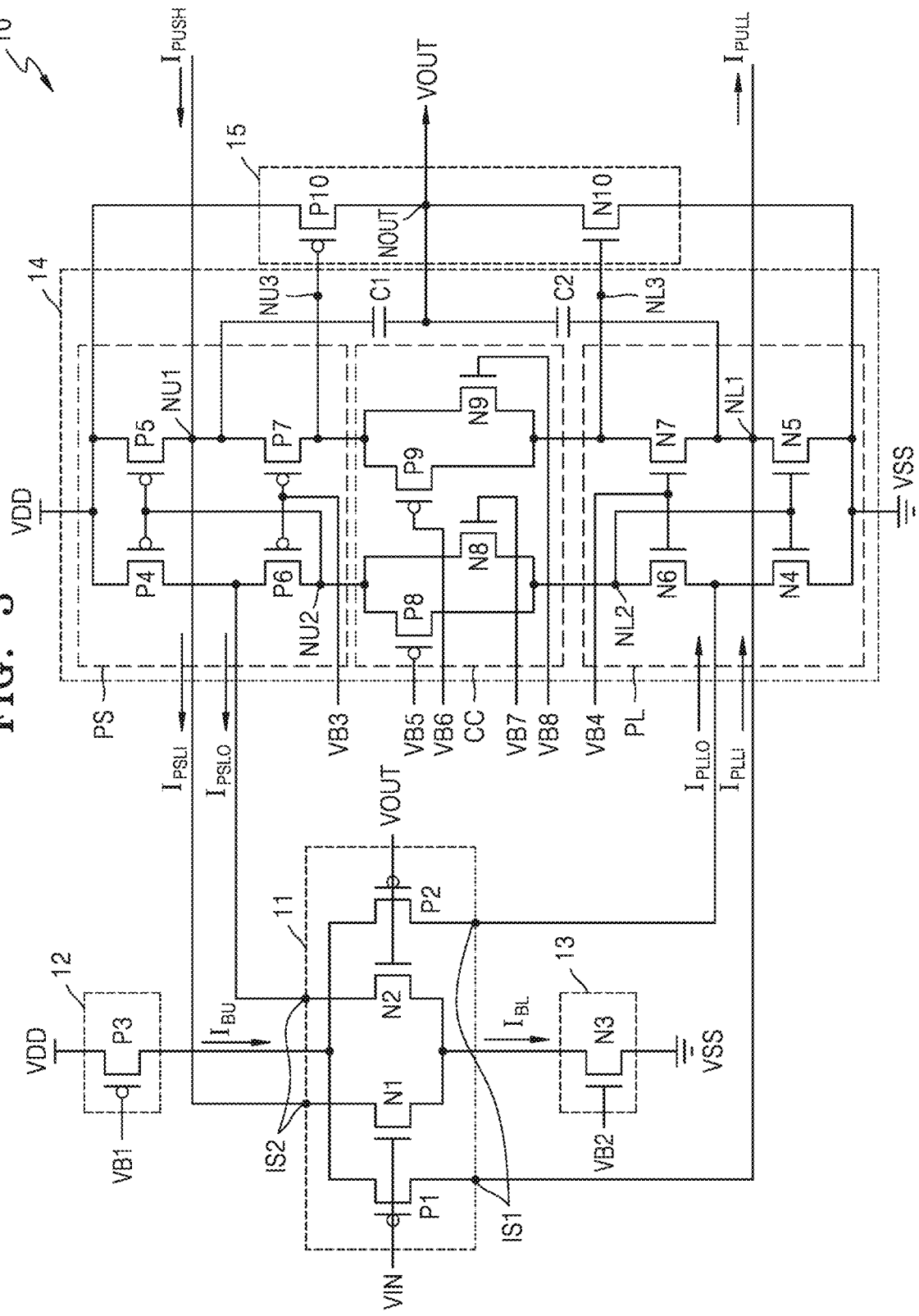
FIG. 3 is a circuit diagram of an operational amplifier according to example embodiments of the inventive concepts.
Figure 4:
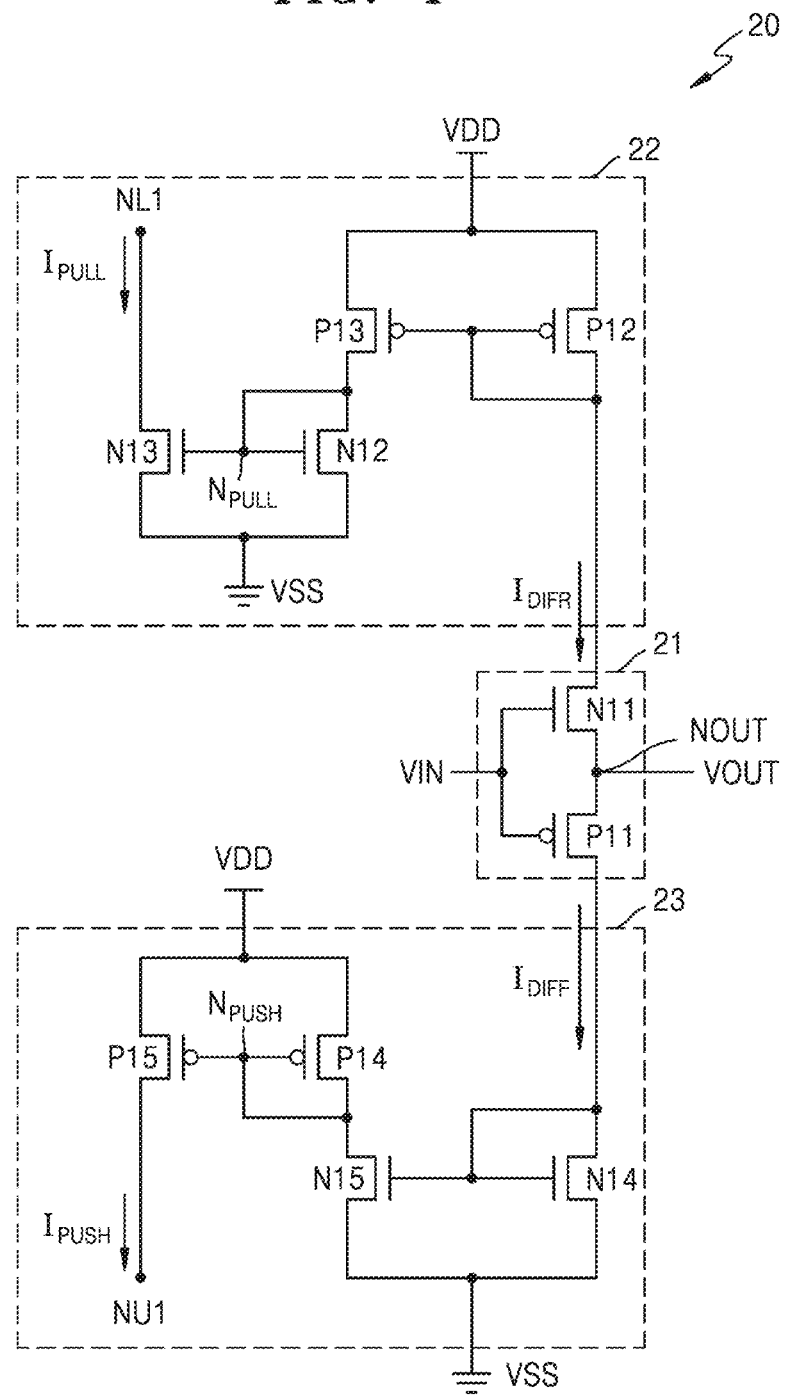
FIG. 4 is a circuit diagram of a slew-rate compensating circuit according to example embodiments of the inventive concepts.
Figure 5:
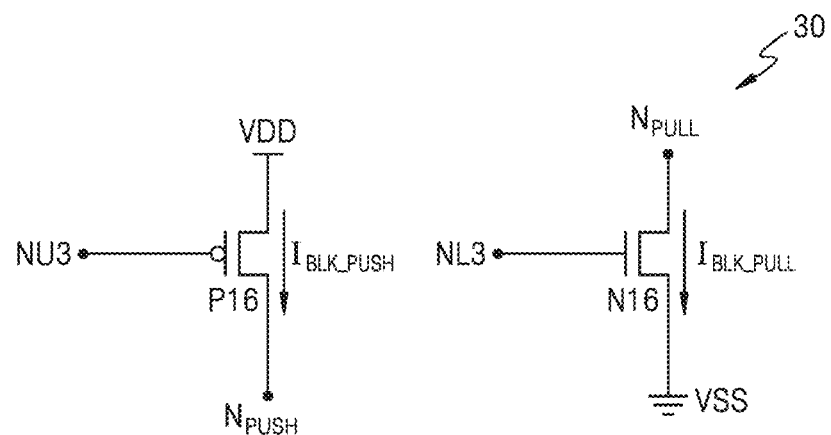
FIG. 5 is a circuit diagram of an offset blocking circuit according to example embodiments of the inventive concepts.

FIGS. 3 to 5 are circuit diagrams of a buffer circuit according to example embodiments of the inventive concepts. In detail, FIG. 3 is a circuit diagram of the operational amplifier 10 of FIGS. 1 and 2, FIG. 4 is a circuit diagram of the slew-rate compensating circuit 20 of FIGS. 1 and 2, and FIG. 5 is a circuit diagram of the offset blocking circuit 30 of FIGS. 1 and 2. Hereinafter, it is described with reference to the above-mentioned drawings.

Referring to FIG. 3, an operational amplifier 10 may include an input stage 11, an upper bias circuit 12, a lower bias circuit 13, a load stage 14, and an output stage 15.

The input stage 11 may have a rail-to-rail structure having a dual structure. The input stage 11 may include a first input terminal IS1 connected to transistors P1 and P2 and a second input terminal IS2 connected to transistors N1 and N2. The first input terminal IS1 may receive pull load currents $I_{PLLI}$ and $I_{PLLO}$ from the load stage 14, and the second input terminal IS2 may receive push load currents $I_{PSLI}$ and $I_{PSLO}$ from the load stage 14. In the following description, including FIG. 3, because the push load currents $I_{PSLI}$ and $I_{PSLO}$ flow from the input stage 11 to the load stage 14, the display of the push load currents $I_{PSLI}$ and $I_{PSLO}$ is shown in the direction of the load stage 14 depending on the flow of the push load currents $I_{PSLI}$ and $I_{PSLO}$.

The upper bias circuit 12 may provide a first bias current $I_{BU}$ to the transistors P1 and P2 based on a first bias voltage VB1. The upper bias circuit 12 may include a transistor P3 that provides a power supply voltage VDD to the input stage 11 by being gated by a first bias voltage VB1. In detail, a drain terminal of the transistor P3 may be connected to the source terminals of the transistors P1 and P2 of the input stage 11.

The lower bias circuit 13 may provide a second bias current $I_{BL}$ to the transistors N1 and N2 based on a second bias voltage VB2. The lower bias circuit 13 may include a transistor N3 that connects a ground voltage to the input stage 11 by being gated by the second bias voltage VB2. In detail, a drain terminal of the transistor N3 may be connected to the source terminals of the transistors N1 and N2 of the input stage 11.

The load stage 14 may include a push load circuit PS, a pull load circuit PL, a connection circuit CC, a first capacitor C1, and a second capacitor C2.

The push load circuit PS may include transistors P4 and P5 connected in the form of a current mirror and transistors P6 and P7 connected between the transistors P4 and P5 and the connection circuit CC and operated in response to a third bias voltage VB3.

The push load circuit PS may receive a push compensation current $I_{PUSH}$ from the slew-rate compensating circuit 20 through a first upper node NU1. The push load circuit PS may generate push load currents $I_{PSLI}$ and $I_{PSLO}$ based on the push compensation current $I_{PUSH}$. The push load circuit PS may provide the push load currents $I_{PSLI}$ and $I_{PSLO}$ to the second input terminal IS2 through each of a drain terminal of the transistor P5 and a source terminal of the transistor P6.

The pull load circuit PL may include transistors N4 and N5 connected in the form of a current mirror and transistors N6 and N7 connected between the transistors N4 and N5 and the connection circuit CC and operated in response to a fourth bias voltage VB4.

The pull load circuit PL may receive a pull compensation current $I_{PULL}$ through a first lower node NL1. The pull load circuit PL may generate pull load currents $I_{PLLI}$ and $I_{PLLO}$ based on the pull compensation current $I_{PULL}$. The pull load currents $I_{PLLI}$ and $I_{PLLO}$ may flow from the first input stage IS1 to a drain terminal of the transistor N5 and a source terminal of the transistor N6.

The connection circuit CC may be disposed between the push load circuit PS and the pull load circuit PL. The connection circuit CC may electrically connect a second upper node NU2 of the push load circuit PS to a second lower node NL2 of the pull load circuit PL, and may electrically connect a third upper node NU3 of the push load circuit PS to a third lower node NL3 of the pull load circuit PL. The third upper node NU3 of the push load circuit PS may be referred to as a 'push connection node', and the third lower node NL3 of the pull load circuit PL may be referred to as a 'pull connection node'.

The connection circuit CC may include transistors P8, P9, N8, and N9, and the transistors P8, P9, N8, and N9 may operate in response to fifth to eighth bias voltages VB5 to VB8, respectively. The fifth to eighth bias voltages VB5 to VB8 may be the same as or different from each other. For example, all of the fifth to eighth bias voltages VB5 to VB8 may have different voltage levels. In another example embodiment, at least two of the fifth to eighth bias voltages VB5 to VB8 may have the same voltage level.

The first capacitor C1 may be connected between the first upper node NU1 and an output node NOUT of the push load circuit PS, and the second capacitor C2 may be connected between the first lower node NL1 and the output node NOUT of the pull load circuit PL.

The output stage 15 may include transistors P10 and N10. A gate of the transistor P10 may be connected to the third upper node NU3 of the push load circuit PS. One end of the transistor P10 is connected to the output node NOUT, and the power supply voltage VDD may be applied from the other end thereof. A gate of the transistor N10 may be connected to the third lower node NL3 of the pull load circuit PL. One end of the transistor N10 may be connected to the output node NOUT, and a ground voltage may be applied from the other end thereof In one example embodiment according to the inventive concepts, the transistors P1 to P10 may include a PFET, and the transistors N1 to N10 may include an NFET, but the inventive concepts are not limited thereto.

Referring to FIG. 4, a slew-rate compensating circuit 20 may include a comparison circuit 21, a pull compensation current circuit 22, and a push compensation current circuit 23.

The comparison circuit 21 may receive an input voltage VIN and an output voltage VOUT. The comparison circuit 21 may include transistors N11 and P11 having gates to which the input voltage VIN is applied. The output voltage VOUT may be applied to a source terminal of the transistor N11 and a drain terminal of the transistor P11. The comparison circuit 21 may compare the voltage level of the input voltage VIN to the voltage level of the output voltage VOUT, and may generate comparison currents $I_{DIFR}$ and $I_{DIFF}$ based on the comparison result. That is, the comparison currents $I_{DIFR}$ and $I_{DIFF}$ may be currents corresponding to a difference between the voltage level of the input voltage VIN and the voltage level of the output voltage VOUT.

When the difference between the voltage level of the input voltage VIN of the operational amplifier 10 and the voltage level of the output voltage VOUT is greater than the reference voltage level and the level of the input voltage VIN is greater than the level of the output voltage VOUT, it may be expressed as 'the input voltage VIN is rising'. For example, when the input voltage VIN is rising, the input voltage VIN may transition from a logical low level to a logical high level. The reference voltage level may be a threshold voltage level of the transistors N11 and P11.

When the input voltage VIN is rising, the comparison circuit 21 may turn on the transistor N11 and turn off the transistor P11. That is, the pull compensation current circuit 22 may be activated, and the push compensation current circuit 23 may be deactivated. As the transistor N11 is turned on, the comparison circuit 21 may generate the rising comparison current $I_{DIFR}$.

Further, when the difference between the voltage level of the input voltage VIN and the voltage level of the output voltage VOUT of the operational amplifier 10 is greater than the reference voltage level and the level of the input voltage VIN is less than the level of the output voltage VOUT, it may be expressed as 'the input voltage VIN is falling'. For example, when the input voltage VIN is falling, the input voltage VIN may transition from a logic high level to a logic low level.

When the input voltage VIN is falling, the comparison circuit 21 may turn on the transistor P11 and turn off the transistor N11. That is, the pull compensation current circuit 22 may be deactivated, and the push compensation current circuit 23 may be activated. As the transistor P11 is turned on, the comparison circuit 21 may generate a falling comparison current $I_{DIFF}$.

The pull compensation current circuit 22 may perform a current mirror operation based on a rising comparison current $I_{DIFR}$. Accordingly, the pull compensation current circuit 22 may generate the pull compensation current $I_{PULL}$ and may provide the pull compensation current $I_{PULL}$ to the operational amplifier 10.

In detail, the pull compensation current circuit 22 may include transistors P12, P13, N12, and N13. The transistors P12 and P13 may be connected in the form of a current mirror, and the power supply voltage VDD may be applied from one end thereof. The transistors N12 and N13 may be connected in the form of a current mirror, and a ground voltage VSS may be applied from one end thereof.

A drain node of the transistor P13, a drain node of the transistor N12, and gates of the transistors N12 and N13 may be connected to each other. A node to which the drain node of the transistor P13, the drain node of the transistor N12, and the gates of the transistors N12 and N13 are connected may be referred to as a pulling node $N_{PULL}$ The transistor N13 may be referred to as a 'boosting transistor'.

The pull compensation current circuit 22 may output the pull compensation current $I_{PULL}$ through the boosting transistor N13. Hereinafter, as shown in FIG. 4, although it is shown that the pull compensation current $I_{PULL}$ flows from the first lower node NL1 to the transistor N13 depending on the flow of the current, because the pull compensation current $I_{PULL}$ is generated by the operation of the pull compensation current circuit 22, it may be described that the pull compensation current circuit 22 outputs the pull compensation current $I_{PULL}$. That is, the pull compensation current $I_{PULL}$ from the pull compensation current circuit 22 may be supplied to the first lower node NL1. Because the pull compensation current $I_{PULL}$ flows from the first lower node NL1 to the boosting transistor N13, the pull compensation current circuit 22 may synchronize the pull compensation current $I_{PULL}$ from the load stage 14.

The voltage level of the first lower node NL1 may be further lowered by the pull compensation current $I_{PULL}$. Therefore, the transistor N10 of the output stage 15 of FIG. 3 may be quickly turned off by the pull compensation current $I_{PULL}$. That is, because the voltage level of the output voltage VOUT rises rapidly, the slew rate may be improved.

The push compensation current circuit 23 may perform the current mirror operation based on the falling comparison current $I_{DIFF}$. Accordingly, the push compensation current circuit 23 may generate the push compensation current $I_{PUSH}$ and may provide the push compensation current $I_{PUSH}$ to the operational amplifier 10.

In detail, the push compensation current circuit 23 may include transistors N14, N15, P14, and P15. The transistors N14 and N15 may be connected in the form of a current mirror, and a ground voltage VSS may be applied from one end thereof. The transistors P14 and P15 may be connected in the form of a current mirror, and the power supply voltage VDD may be applied from one end thereof.

A drain node of the transistor N15, a drain node of the transistor P14, and the gates of the transistors P14 and P15 may be connected to each other. A node to which the drain node of the transistor N15, the drain node of the transistor P14, and the gates of the transistors P14 and P15 are connected may be referred to as a push node $N_{PUSH}$ The transistor P15 may be referred to as a 'boosting transistor'.

The push compensation current circuit 23 may output the push compensation current $I_{PUSH}$ through a boosting transistor P15. That is, the push compensation current $I_{PUSH}$ from the push compensation current circuit 23 may be supplied to the first upper node NU1. Because the push compensation current $I_{PUSH}$ flows from the boosting transistor P15 to the first upper node NU1, the push compensation current circuit 23 may supply the push compensation current $I_{PUSH}$ to the load stage 14.

The voltage level of the first upper node NU1 may be further increased by the push compensation current $I_{PUSH}$. Therefore, the transistor P10 of the output stage 15 may be quickly turned off by the push compensation current $I_{PUSH}$. That is, because the voltage level of the output voltage VOUT falls rapidly, the slew rate may be improved.

In one example embodiment according to the inventive concepts, the transistors P11 to P15 may include a PFET, and the transistors N11 to N15 may include an NFET, but the inventive concepts are not limited thereto.

Referring to FIG. 5, the offset blocking circuit 30 may include a push blocking transistor P16 and a pull blocking transistor N16.

A gate of the push blocking transistor P16 may be connected to the third upper node NU3 of the push load circuit PS. In other words, the gate of the push blocking transistor P16 may be connected to the push connection node. Accordingly, the push blocking transistor P16 may operate by the voltage provided from the operational amplifier 10. In more detail, the push blocking transistor P16 may operate by a voltage provided from the load stage 14 of the operational amplifier 10.

The push blocking transistor P16 may be turned on depending on the voltage of the third upper node NU3. That is, the voltage level of the third upper node NU3 may be a voltage level capable of turning on the push blocking transistor P16. The voltage level of the third upper node NU3 may be equal to or higher than the voltage level of the threshold voltage of the push blocking transistor P16. Accordingly, the push blocking transistor P16 may be turned on, and the push blocking current $I_{BLK\_PUSH}$ may be generated.

One end of the push blocking transistor P16 may be connected to the push node $N_{PUSH}$ of the push compensation current circuit 23, and the power supply voltage VDD may be applied from the other end thereof. As the push blocking transistor P16 is turned on by the voltage provided from the load stage 14, the push blocking current $I_{BLK\_PUSH}$ may flow to the push node $N_{PUSH}$. Accordingly, the push blocking transistor P16 may provide a push blocking current $I_{BLK\_PUSH}$ to gates of the transistors P15 and P14 of the push compensation current circuit 23.

When the input voltage VIN is falling and the difference between the voltage level of the input voltage VIN and the voltage level of the output voltage VOUT is greater than the threshold voltage of the transistor P11, the push compensation current circuit 23 may generate the push compensation current $I_{PUSH}$ based on the falling comparison current $I_{DIFF}$ and provide the push compensation current $I_{PUSH}$ to the operational amplifier 10. In this case, the push blocking current $I_{BLK\_PUSH}$ may be provided from the push blocking transistor P16 to the boosting transistor P15, but because the push compensation current $I_{PUSH}$ is strongly generated, the boosting transistor P15 may maintain a turned-on state.

When the input voltage VIN is falling and the difference between the voltage level of the input voltage VIN and the voltage level of the output voltage VOUT is less than the threshold voltage of the transistor P11, the push compensation current circuit 23 may be deactivated. Accordingly, because the push compensation current circuit 23 does not generate the falling comparison current $I_{DIFF}$, the push compensation current $I_{PUSH}$ may not be generated either. In this case, because the push blocking current $I_{BLK\_PUSH}$ may be provided from the push blocking transistor P16 to the boosting transistor P15, a gate voltage of the boosting transistor P15 rises to maintain the turned-off state of the boosting transistor P15. Therefore, even if a leakage current occurs in the push compensation current circuit 23, the transistors P15 and P14 are turned off by the push blocking current $I_{BLK\_PUSH}$, so that a leakage current flowing to the first upper node NU1 of the push load circuit PS may be removed. In addition, the DC offset may be removed, and the operating speed of the buffer circuit may be improved, and the buffer circuit may be driven with low power.

A gate of the pull blocking transistor N16 may be connected to the third lower node NL3 of the pull load circuit PL. In other words, the gate of the pull blocking transistor N16 may be connected to the pull connection node. Accordingly, the pull blocking transistor N16 may be operated by a voltage provided from the operational amplifier 10. In more detail, the pull blocking transistor N16 may be operated by a voltage provided from the load stage 14 of the operational amplifier 10.

The gate of the pull blocking transistor N16 may be turned on depending on a voltage of the third lower node NL3. A voltage level of the third lower node NL3 may have a voltage level capable of turning on the pull blocking transistor N16. That is, the voltage level of the third lower node NL3 may be equal to or greater than the voltage level of the threshold voltage of the pull blocking transistor N16. Accordingly, the pull blocking transistor N16 may be turned on, and a pull blocking current $I_{BLK\_PULL}$ may be generated.

One end of the pull blocking transistor N16 may be connected to a pull node $N_{PULL}$ of the pull compensation current circuit 23, and a ground voltage VSS may be applied from the other end thereof. As the pull blocking transistor N16 is turned on by the voltage provided from the load stage 14, the blocking current $I_{BLK\_PULL}$ may flow from the pull node $N_{PULL}$ Accordingly, a pull blocking current $I_{BLK\_PULL}$ may flow in a direction of the pull blocking transistor N16 from the gates of the transistors N12 and N13 of the pull compensation current circuit 22. In the following description, including FIG. 3, although it is shown that the pull blocking current $I_{BLK\_PULL}$ flows in a direction of the ground voltage VSS from the pull node $N_{PULL}$ depending on the flow of the pull blocking current $I_{BLK\_PULL}$, because the pull blocking current $I_{BLK\_PULL}$ affects the slew-rate compensating circuit 20 by being generated by the pull blocking transistor N16, it may be described that the pull blocking transistor N16 provides the pull blocking current $I_{BLK\_PULL}$ to the pull compensation current circuit 22.

When the input voltage VIN is rising and the difference between the voltage level of the input voltage VIN and the voltage level of the output voltage VOUT is greater than the threshold voltage of the transistor N11, the pull compensation current circuit 22 may generate the pull compensation current $I_{PULL}$ based on the rising comparison current $I_{DIFR}$ and provide the pull compensation current $I_{PULL}$ to the operational amplifier 10. In this case, the pull blocking current $I_{BLK\_PULL}$ may be provided from the pull blocking transistor N16 to the boosting transistor N13, but because the pull compensation current $I_{PULL}$ is strongly generated, the boosting transistor N13 may maintain a turned-on state.

When the input voltage VIN is rising and the difference between the voltage level of the input voltage VIN and the voltage level of the output voltage VOUT is less than the threshold voltage of the transistor N11, because the pull compensation current circuit 22 does not generate the rising comparison current $I_{DIFR}$, the pull compensation current $I_{PULL}$ may not be generated either. In this case, because the pull blocking current $I_{BLK\_PULL}$ is generated, the pull blocking current $I_{BLK\_PULL}$ may flow from the boosting transistor N13 to the pull blocking transistor N16. Accordingly, because a gate voltage level of the boosting transistor N13 is lowered, the boosting transistor N13 may maintain a turned-off state. Therefore, even if a leakage current occurs in the pull compensation current circuit 22, the boosting transistors N13 is turned off by the push blocking current $I_{BLK\_PULL}$, so that a leakage current flowing to the first lower node NL1 of the pull load circuit PL may be removed. In addition, the DC offset may be removed, and the operating speed of the buffer circuit may be improved, and the buffer circuit may be driven with low power.

In one example embodiment according to the inventive concepts, it is illustrated that the gate of the push blocking transistor P16 is connected to the third upper node NU3, and the gate of the pull blocking transistor N16 is connected to the third lower node NL3, but the inventive concept is not limited thereto. For example, gates of the push blocking transistor P16 and the pull blocking transistor N16 may be connected to any node that provides a voltage capable of turning on the push blocking transistor P16 and the pull blocking transistor N16 among nodes of the load stage 14. For example, the gate of the push blocking transistor P16 may be connected to a node providing a level greater than a voltage level of a threshold voltage of the push blocking transistor P16 among nodes of the load stage 14. For example, the gate of the pull blocking transistor N16 may be connected to a node providing a voltage level greater than a voltage level of a threshold voltage of the pull blocking transistor N16 among nodes of the load stage 14.

In one example embodiment in accordance with the inventive concepts, the push blocking transistor P16 may include a PFET, and the pull blocking transistor N16 may include an NFET, but are not limited thereto. Hereinafter, various example embodiments of the buffer circuit BF are described.

Figure 6:
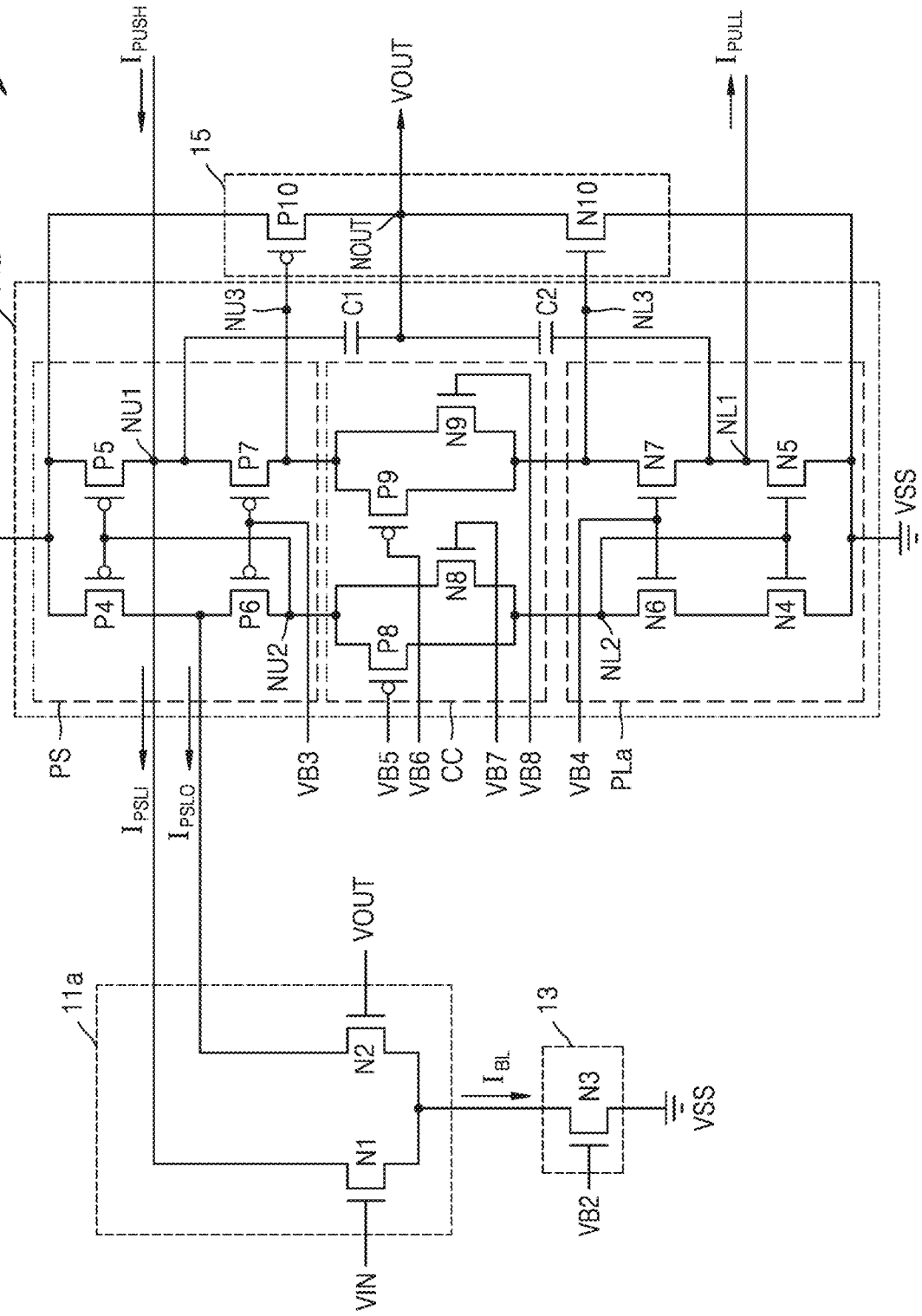
FIG. 6 is a circuit diagram of an operational amplifier according to example embodiments of the inventive concepts.

FIG. 6 is a circuit diagram of an operational amplifier according to example embodiments of the inventive concepts. In detail, FIG. 6 is a circuit diagram illustrating an operational amplifier 10a as another example embodiment of FIGS. 2 and 3. Hereinafter, it is described with reference to FIGS. 1 to 3, and descriptions already given are omitted.

Referring to FIG. 6, the operational amplifier 10a may include an input stage 11a, a lower bias circuit 13, a load stage 14a, and an output stage 15.

The input stage 11a may have a single structure from which transistors P1 and P2 are omitted. The input stage 11a may be connected to transistors N1 and N2, and may receive push load currents $I_{PSLI}$ and $I_{PSLO}$ from the load stage 14a.

The lower bias circuit 13 may provide a second bias current $I_{BL}$ to the input stage 11a based on the second bias voltage VB2. Unlike the operational amplifier 10 of FIG. 3, the upper bias circuit 12 may be omitted.

The load stage 14a may include a push load circuit PS, a pull load circuit PLa, a connection circuit CC, a first capacitor C1, and a second capacitor C2. The push load circuit PS may receive a push compensation current $I_{PUSH}$ from the slew-rate compensating circuit 20 through a first upper node NU1 and generate push load currents $I_{PSLI}$ and $I_{PSLO}$ based on the push compensation current $I_{PUSH}$. The push load circuit PS may provide the push load currents $I_{PSLI}$ and $I_{PSLO}$ to a second input terminal IS2 through a drain terminal of the transistor P4 and a drain terminal of the transistor P5. The pull load circuit PLa may receive the pull compensation current $I_{PULL}$ through a first lower node NL1, but may not provide the pull load currents $I_{PLLI}$ and $I_{PLLO}$ of FIG. 3.

Figure 7:
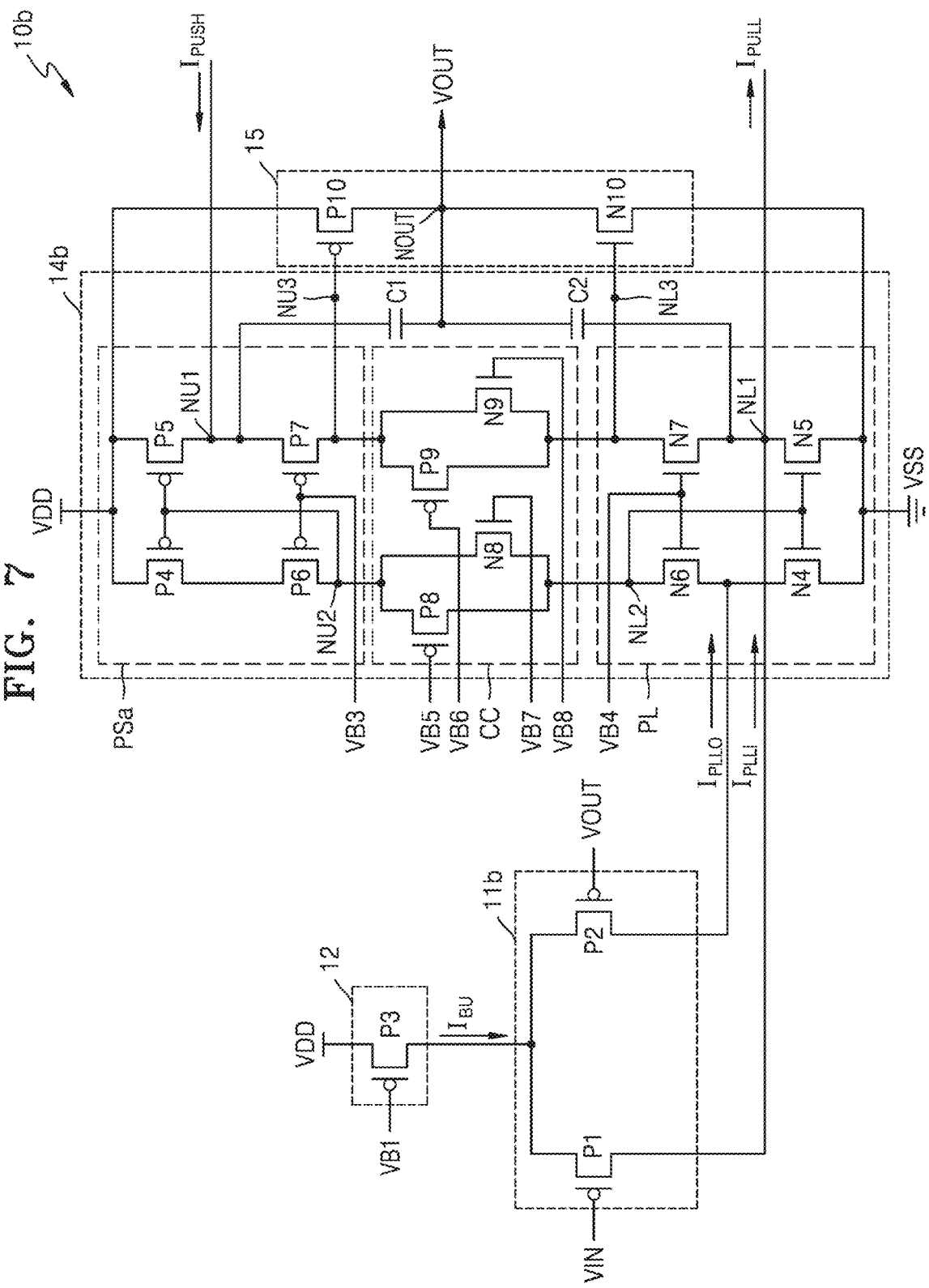
FIG. 7 is a circuit diagram of an operational amplifier according to example embodiments of the inventive concepts.

FIG. 7 is a circuit diagram of an operational amplifier according to example embodiments of the inventive concepts. In detail, FIG. 7 is a circuit diagram illustrating an operational amplifier 10b as another example embodiment of FIG. 2. Hereinafter, it is described with reference to FIG. 3, and descriptions already given are omitted.

Referring to FIG. 7, the operational amplifier 10b may include an input stage 11b, an upper bias circuit 12, a load stage 14b, and an output stage 15.

The input stage 11b may have a single structure. The input stage 11 may be connected to transistors P1 and P2, and may receive pull load currents $I_{PLLI}$ and $I_{PLLO}$ from the load stage 14b.

The upper bias circuit 12 may provide a first bias current $I_{BU}$ to the input stage 11b based on a first bias voltage VB1. Unlike the operational amplifier 10 of FIG. 3, the lower bias circuit 13 may be omitted.

The load stage 14b may include a push load circuit PSa, a pull load circuit PL, a connection circuit CC, a first capacitor C1, and a second capacitor C2. The push load circuit PSa may receive a push compensation current $I_{PUSH}$ through a first upper node NU1, but may not provide the push load currents $I_{PSLI}$ and $I_{PSLO}$ of FIG. 3. The pull load circuit PL may receive a pull compensation current $I_{PULL}$ from the slew-rate compensating circuit 20 through a first lower node NL1, and may generate the pull load currents $I_{PLLI}$ and $I_{PLLO}$ based on the pull compensation current $I_{PULL}$. The pull load circuit PL may provide the pull load currents $I_{PLLI}$ and $I_{PLLO}$ to the input stage 11b through a drain terminal of the transistor N4 and a drain terminal of the transistor N5.

Figure 8:
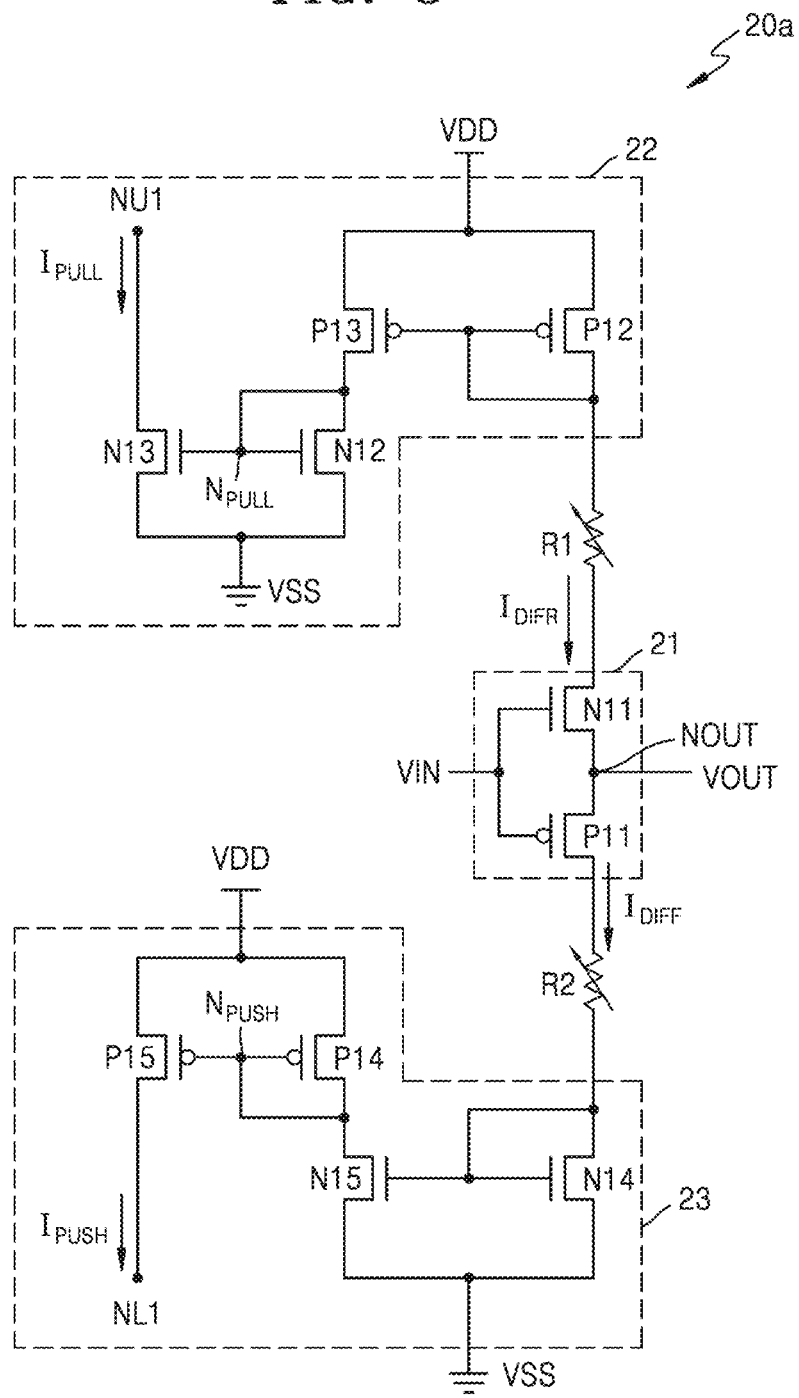
FIG. 8 is a circuit diagram of a slew-rate compensating circuit according to example embodiments of the inventive concepts.

FIG. 8 is a circuit diagram of a slew-rate compensating circuit according to example embodiments of the inventive concepts. In detail, FIG. 8 is a circuit diagram for explaining a slew-rate compensating circuit 20a as another example embodiment of FIG. 4. Hereinafter, it is described with reference to FIG. 4, and descriptions already given are omitted.

Referring to FIG. 8, the slew-rate compensating circuit 20a may include a comparator circuit 21, a pull compensation current circuit 22, a push compensation current circuit 23, and first and second variable resistors R1 and R2.

The first variable resistor R1 may be connected between the comparison circuit 21 and the pull compensation current circuit 22. The second variable resistor R2 may be connected between the comparison circuit 21 and the push compensation current circuit 23. The slew-rate compensating circuit 20a includes the first and second variable resistors R1 and R2 to control an amount of current of a rising comparison current $I_{DIFR}$ and a falling comparison current $I_{DIFF}$. That is, the slew-rate compensating circuit 20a includes the first and second variable resistors R1 and R2, so that the operating speed of the slew-rate compensating circuit 20a may be controlled, and thus, the operating speed of the operational amplifier 10 may be controlled.

Figure 9:
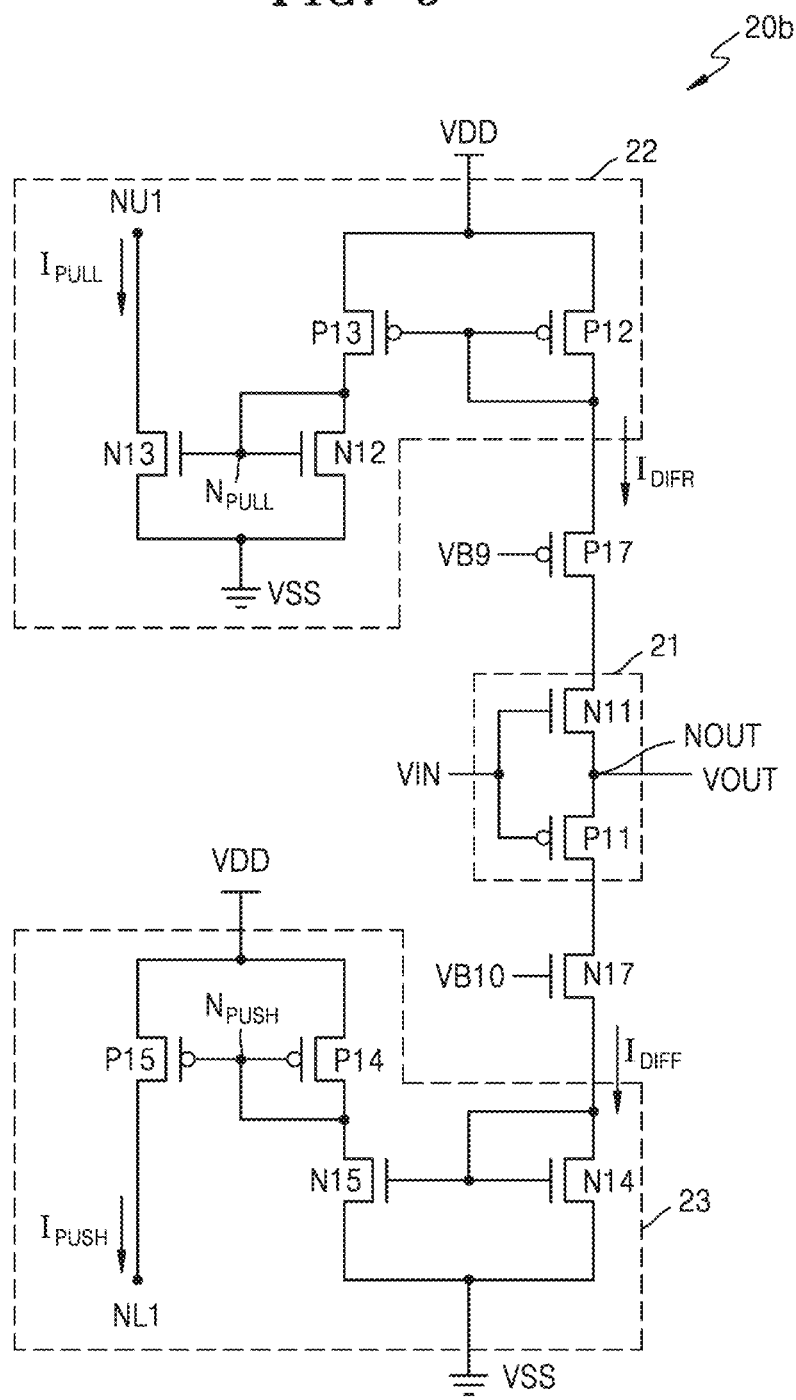
FIG. 9 is a circuit diagram of a slew-rate compensating circuit according to example embodiments of the inventive concepts.

FIG. 9 is a circuit diagram of a slew-rate compensating circuit according to example embodiments of the inventive concepts. In detail, FIG. 9 is a circuit diagram illustrating a slew-rate compensating circuit 20b as another example embodiment of FIG. 4. Hereinafter, it is described with reference to FIG. 4, and descriptions already given are omitted.

Referring to FIG. 9, the slew-rate compensating circuit 20b may include a comparison circuit 21, a pull compensation current circuit 22, a push compensation current circuit 23, and first and second control transistors P17 and N17.

The first control transistor P17 may have a gate to which a ninth bias voltage VB9 is applied, one end of the first control transistor P17 may be connected to the comparison circuit 21, and the other end thereof may be connected to the pull compensation current circuit 22. By varying the ninth bias voltage VB9, an amount of current of a rising comparison current $I_{DIFR}$ may be controlled.

The second control transistor N17 may have a gate to which a tenth bias voltage VB10 is applied, one end of the second control transistor N17 may be connected to the comparison circuit 21, and the other end thereof may be connected to the push compensation current circuit 23. By varying the tenth bias voltage VB10, an amount of current of a falling comparison current $I_{DIFF}$ may be controlled.

That is, the slew-rate compensating circuit 20b includes the first and second control transistors P17 and N17, so that the operating speed of the slew-rate compensating circuit 20b may be controlled, and thus, the operating speed of the operational amplifier 10 may be controlled.

Figure 10:
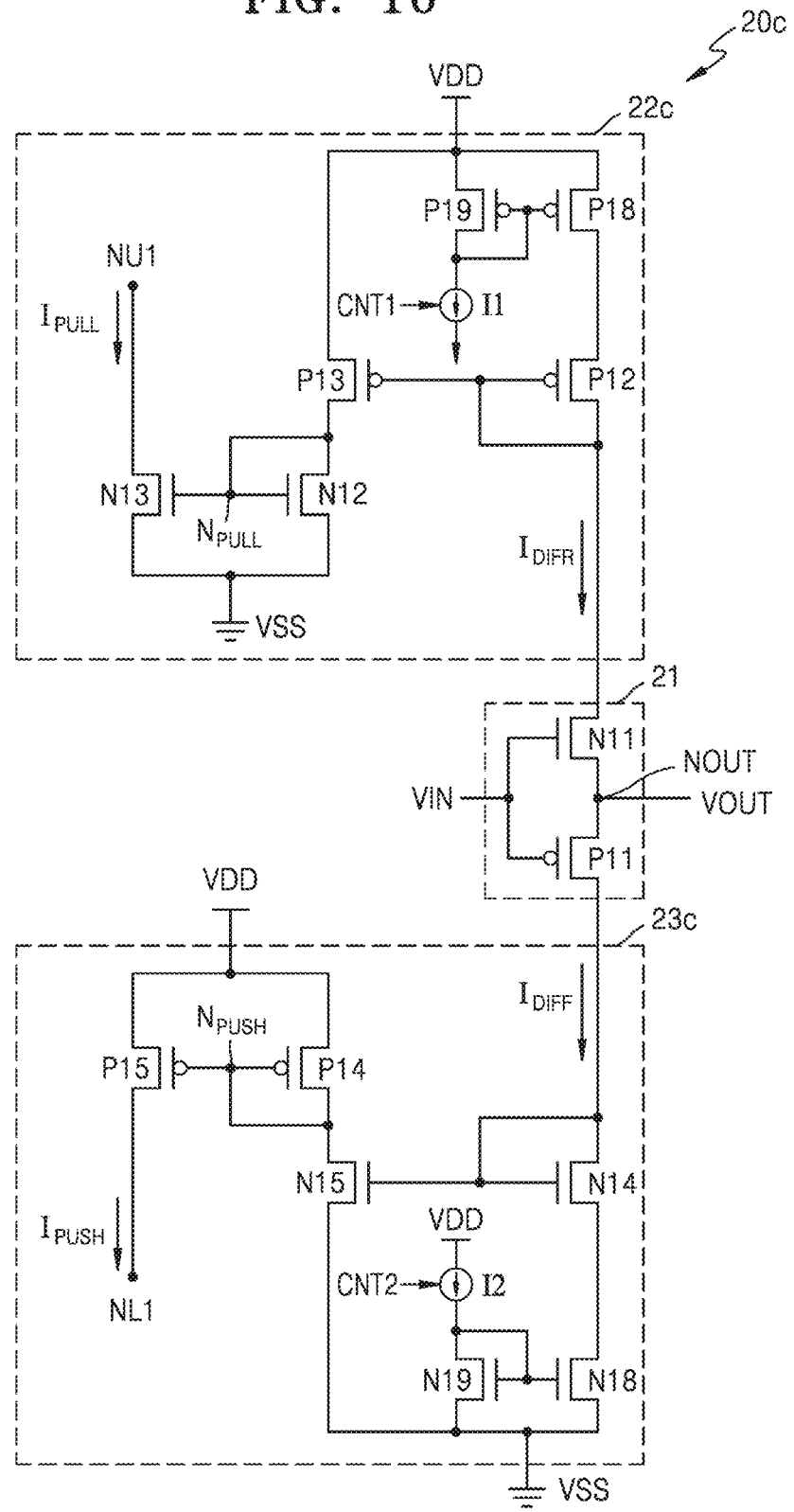
FIG. 10 is a circuit diagram of a slew-rate compensating circuit according to example embodiments of the inventive concepts.

FIG. 10 is a circuit diagram of a slew-rate compensating circuit according to example embodiments of the inventive concepts. In detail, FIG. 10 is a circuit diagram for explaining the slew-rate compensating circuit 20c as another example embodiment of FIG. 4. Hereinafter, it is described with reference to FIG. 4, and descriptions already given are omitted.

Referring to FIG. 10, the slew-rate compensating circuit 20c may include a comparison circuit 21, a pull compensation current circuit 22c, and a push compensation current circuit 23c.

The pull compensation current generation circuit 22c may include transistors P12, P13, N12, N13, P18, and P19 and a first current source I1. The first current source I1 may generate a first power supply current in response to a first control signal CNT1. The first control signal CNT1 may be a signal provided from the outside of the slew-rate compensating circuit 20d.

The transistors P18 and P19 may be connected as a current mirror. One end of the transistor P18 may be connected to the transistor P12, and a power supply voltage VDD may be applied to the other end thereof. One end of the transistor P19 may be connected to the first current source I1, and the power supply voltage VDD may be applied to the other end thereof.

The push compensation current generating circuit 23c may include transistors N14, N15, P14, P15, N18, and N19 and a second current source I2. The second current source I2 may generate a second power current in response to a second control signal CNT2. The second control signal CNT2 may be a signal provided outside the slew-rate compensating circuit 20d.

The transistors N18 and N19 may be connected as a current mirror. One end of the transistor N18 may be connected to the transistor N14, and a ground voltage VSS may be applied to the other end thereof. One end of the transistor N19 may be connected to a second current source I2, and a ground voltage VSS may be applied to the other end thereof.

Figure 11:
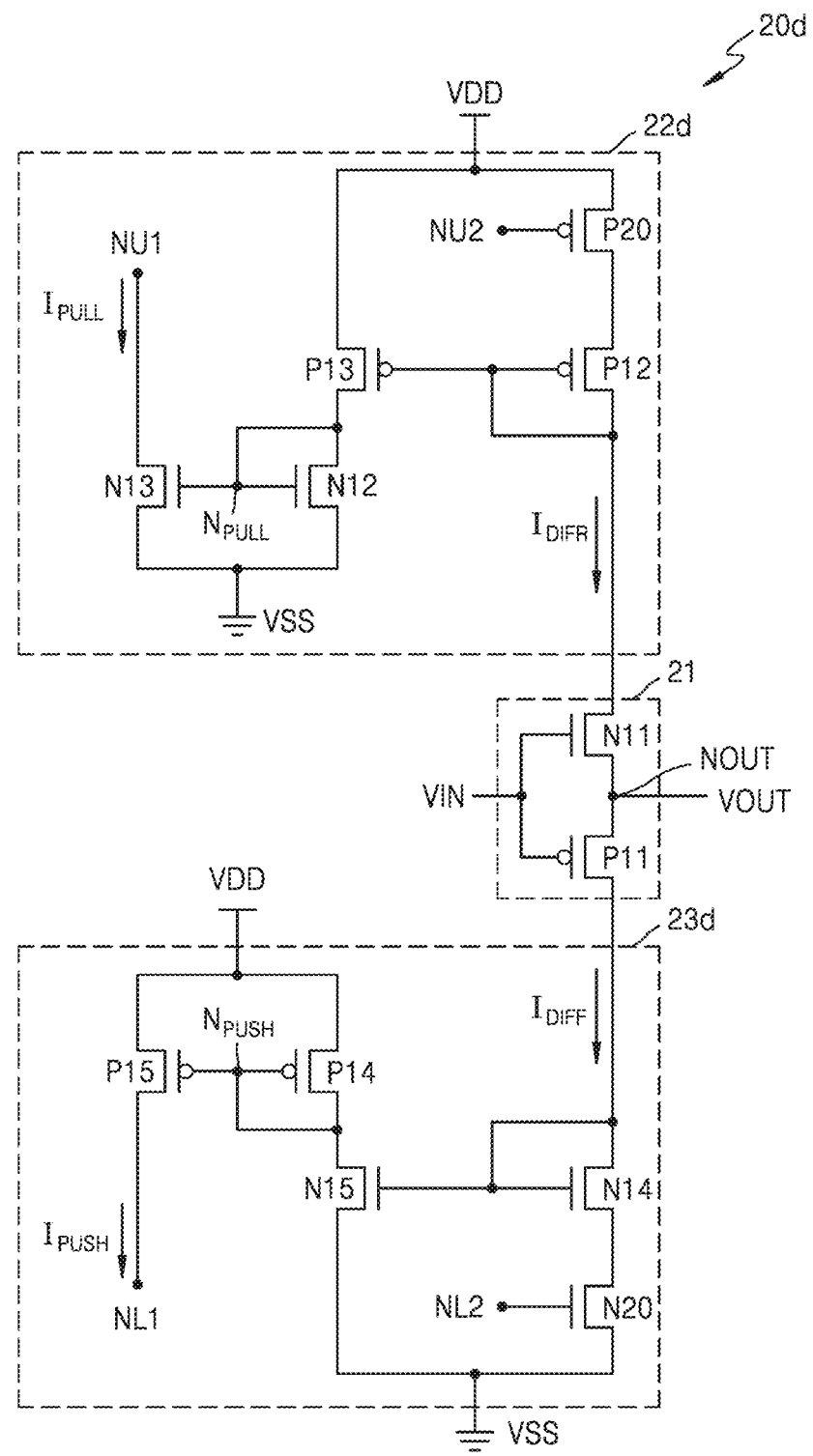
FIG. 11 is a circuit diagram of a slew-rate compensating circuit according to example embodiments of the inventive concepts.

FIG. 11 is a circuit diagram of a slew-rate compensating circuit according to example embodiments of the inventive concepts. In detail, FIG. 11 is a circuit diagram for explaining a slew-rate compensating circuit 20d as another example embodiment of FIG. 4. Hereinafter, it is described with reference to FIGS. 3 and 4, and descriptions already given are omitted.

Referring to FIG. 11, the slew-rate compensating circuit 20d may include a comparison circuit 21, a pull compensation current circuit 22d, and a push compensation current circuit 23d.

The pull compensation current generation circuit 22d may include transistors P12, P13, N12, N13, and P20. A gate of the transistor P20 may be connected to a second upper node NU2 of the push load circuit PS. One end of the transistor P20 may be connected to the transistor P12, and the power voltage VDD may be applied to the other end thereof.

The push compensation current generation circuit 23d may include transistors N14, N15, P14, P15, and N20. A gate of the transistor N20 may be connected to a second lower node NL2 of the pull load circuit PL. One end of the transistor N20 may be connected to the transistor N14, and a ground voltage VSS may be applied to the other end thereof.

Figure 12:
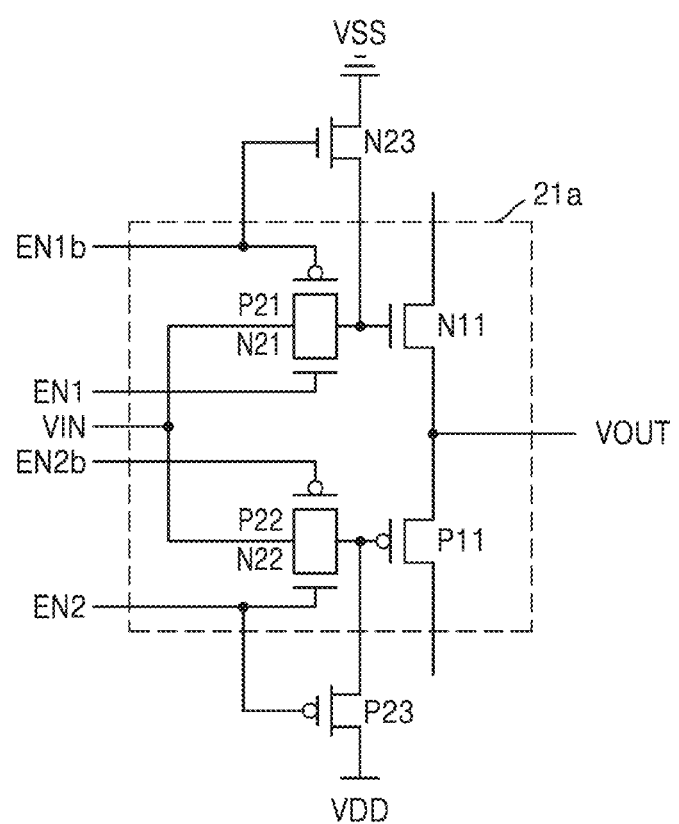
FIG. 12 is a circuit diagram of a slew-rate compensating circuit according to example embodiments of the inventive concepts.

FIG. 12 is a circuit diagram of a slew-rate compensating circuit according to example embodiments of the inventive concepts. In detail, FIG. 12 is a circuit diagram illustrating a comparison circuit 21a as another example embodiment of the comparison circuit included in the slew-rate compensating circuit of FIG. 4. Hereinafter, it is described with reference to FIG. 4, and descriptions already given are omitted.

Referring to FIG. 12, the comparison circuit 21a may include transistors N11, P11, N21, P21, N22, P22, N23, and P23.

The transistor P21 may receive a first inversion enable signal EN1b through a gate of the transistor P21, and one end of the transistor P21 may be connected to the gate terminal of the transistor N11 and the input voltage VIN may be applied to the other end thereof.

The transistor N21 may receive a first enable signal EN1 through a gate of the transistor N21, and one end of the transistor N21 may be connected to the gate terminal of the transistor N11 and the input voltage VIN may be applied to the other end thereof. The first inverted enable signal EN1b may be an inverted signal of the first enable signal EN1. For example, when the first enable signal EN1 has a high level, the first inverted enable signal EN1b may have a low level.

The transistor P22 may receive the second inversion enable signal EN2b through a gate of the transistor P22, one end of the transistor P22 may be connected to the gate terminal of the transistor P11, and the input voltage VIN may be applied to other end thereof.

The transistor N22 may receive a second enable signal EN2 through a gate of the transistor N22, one end of the transistor N22 may be connected to the gate terminal of the transistor P11, and the input voltage VIN may be applied to the other end thereof. A second inverted enable signal EN2b may be a signal in which the second enable signal EN2 is inverted. For example, when the second enable signal EN2 has a high level, the second inverted enable signal EN2b may have a low level.

The first enable signal EN1, the first inverted enable signal EN1b, the second enable signal EN2, and the second inverted enable signal EN2b may be control signals for controlling the comparison circuit 21a. The first enable signal EN1, the first inverted enable signal EN1b, the second enable signal EN2, and the second inverted enable signal may be signals provided from the outside of the slew-rate compensating circuit 20. The first enable signal EN1 and the second enable signal EN2 may be signals having the same level. The first inverted enable signal EN1b and the second inverted enable signal EN2b may be signals having the same level.

The gate of the transistor N23 receives a first inversion enable signal EN1b, one end of the transistor N23 may be connected to the gate of the transistor N11, and the ground voltage VSS may be applied to the other end thereof. The gate of the transistor N23 receives the first inversion enable signal EN1b, one end of the transistor N23 may be connected to the gate of the transistor N11, and the ground voltage VSS may be applied to the other end thereof.

The comparison circuit 21a includes transistors N21, P21, N22, P22, N23, and P23, so that when the pull compensation current circuit 22 or the push compensation current circuit 23 is deactivated, the comparison currents $I_{DIFR}$ and $I_{DIFF}$ may be prevented from being generated. When the first and second enable signals EN1 and EN2 have a low level and the first and second inverted enable signals EN1b and EN2b have a high level, the gates of the transistors N11 and P11 may not float.

Figure 13:
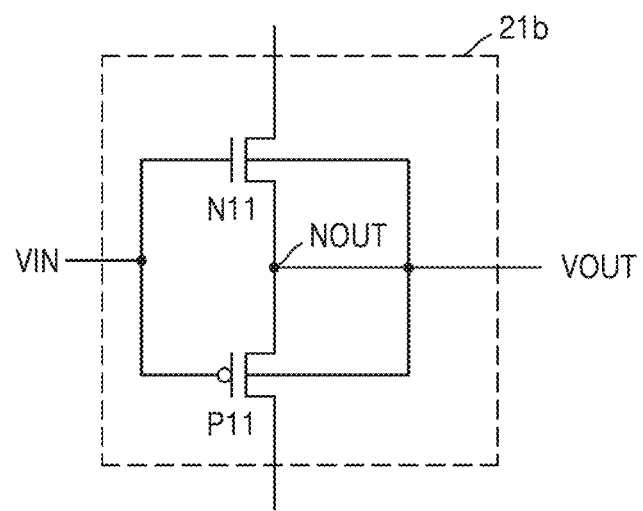
FIG. 13 is a circuit diagram of a slew-rate compensating circuit according to example embodiments of the inventive concepts.

FIG. 13 is a circuit diagram of a slew-rate compensating circuit according to example embodiments of the inventive concepts. In detail, FIG. 13 is a circuit diagram illustrating a comparison circuit 21b as another example embodiment of a comparison circuit included in the slew-rate compensating circuit of FIG. 4. Hereinafter, it is described with reference to FIG. 4, and descriptions already given are omitted.

Referring to FIG. 13, the comparison circuit 21b may include transistors N11 and P11. A gate of the transistor N11 may be electrically connected to a gate of the transistor P11, and bodies of the transistors N11 and P11 may be electrically connected to an output node NOUT. In addition, source terminals of the transistors N11 and P11 may be electrically connected to the output node NOUT.

As the bodies of the transistors N11 and P11 are electrically connected to the source terminals of the transistors N11 and P11, even if a back-bias voltage applied to the body of the transistors N11 and P11 changes, levels of threshold voltages of the transistors N11 and P11 may be constantly maintained.

Figure 14:
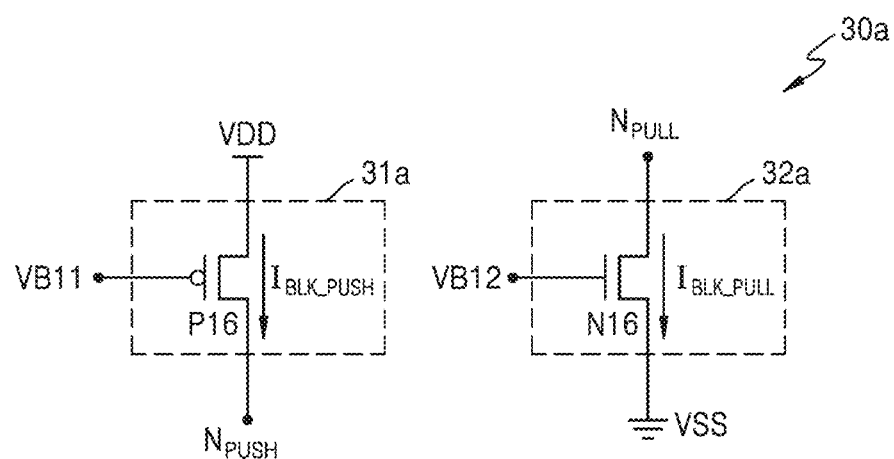
FIG. 14 is a circuit diagram of an offset blocking circuit according to example embodiments of the inventive concepts.

FIG. 14 is a circuit diagram of an offset blocking circuit according to example embodiments of the inventive concepts. In detail, FIG. 14 is a circuit diagram illustrating an offset blocking circuit 30a as another example embodiment of FIG. 5. Hereinafter, it is described with reference to FIG. 5, and descriptions already given are omitted.

Referring to FIG. 14, the offset blocking circuit 30a may include a push blocking transistor P16 and a pull blocking transistor N16.

An eleventh bias voltage VB11 may be applied to a gate of the push blocking transistor P16, one end of the push blocking transistor P16 may be connected to the pull node $N_{PULL}$ and the power supply voltage VDD may be applied to the other end thereof. The level of the eleventh bias voltage VB11 may be equal to or greater than a threshold voltage level of the push blocking transistor P16.

A twelfth bias voltage VB12 may be applied to a gate of the pull blocking transistor N16, one end of the pull blocking transistor N16 may be connected to a push node $N_{PUSH}$, and the ground voltage VSS may be applied to the other end thereof. The level of the twelfth bias voltage VB12 may be equal to or greater than a threshold voltage level of the pull blocking transistor N16.

The offset blocking circuit 30a may be controlled by applying bias voltages VB11 and VB12 to gates of the push blocking transistor P16 and the pull blocking transistor N16.

Figure 15:
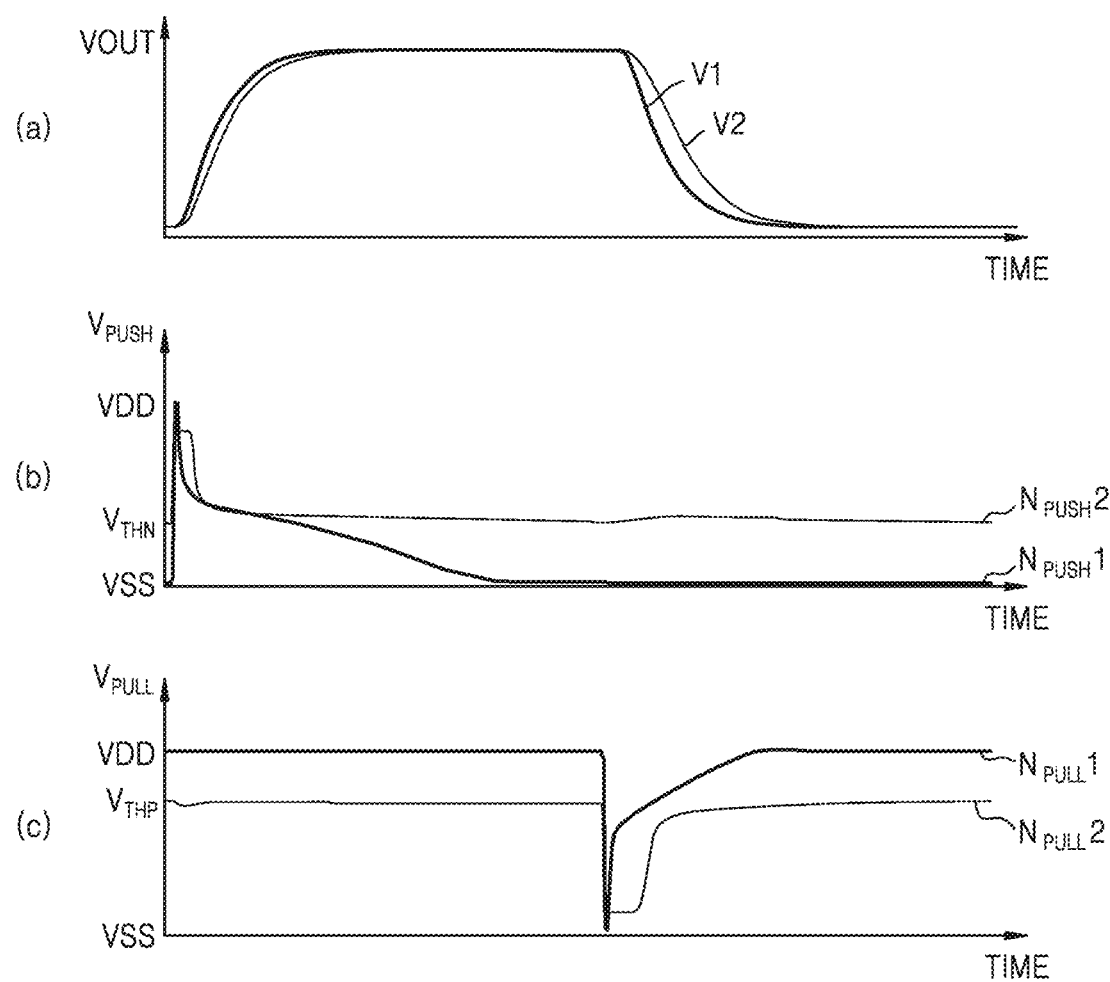
FIG. 15 is a diagram illustrating a voltage measured in the nodes of the buffer circuit according to example embodiments of the inventive concepts.

FIG. 15 is a diagram illustrating voltages measured at nodes of the buffer circuit according to example embodiments of the inventive concepts. In detail, graph (a) is a diagram showing the waveform of an output voltage VOUT of a buffer circuit BF according to the inventive concepts compared with the conventional buffer circuit, graph (b) is a diagram showing the waveform of a voltage $V_{PUSH}$ of a push node $N_{PUSH}$ in the buffer circuit BF according to the inventive concepts compared with the conventional buffer circuit when an input voltage VIN is rising, and graph (c) is a diagram illustrating the waveform of a voltage $V_{PULL}$ of a full node $N_{PULL}$ in the buffer circuit BF according to the inventive concepts compared with the conventional buffer circuit when the input voltage VIN is falling. In FIG. 15, the horizontal axis may indicate time and the vertical axis may indicate voltage. Hereinafter, it is described with reference to FIGS. 2 to 5.

Referring to FIG. 15, in the graph (a), according to the inventive concepts, an output voltage V1 of a buffer circuit BF including an operational amplifier 10, a slew-rate compensating circuit 20, and an offset blocking circuit 30 has a shorter transition time than an output voltage V2 of the buffer circuit in which the slew-rate compensating circuit 20 and the offset blocking circuit 30 are omitted. That is, in the graph (a), the rate of change of the output voltage V1 represented by the slope is greater than the rate of change of the output voltage V2. Because the output voltage in the graph of output voltage V1 changes more rapidly, the slew rate of the buffer circuit BF according to the inventive concepts is improved, compared to the buffer circuit in which the slew-rate compensating circuit 20 and the offset blocking circuit 30 are omitted.

In addition, in the graph (b), when the difference between the voltage level of the input voltage VIN and the voltage level of the output voltage VOUT becomes less than the threshold voltage level of the transistor N11 included in the comparator 21, according to the inventive concepts, the voltage level of the push node $N_{PUSH}$ of the buffer circuit BF including the slew-rate compensating circuit 20 and the offset blocking circuit 30 may be equal to the voltage level of the ground voltage VSS. However, the voltage level of the push node $N_{PUSH2}$ of the buffer circuit in which the slew-rate compensating circuit 20 and the offset blocking circuit 30 are omitted may be the same as a voltage level of a threshold voltage $V_{THN}$ of the transistor N11.

In the graph (c), when the difference between the voltage level of the input voltage YIN and the voltage level of the output voltage VOUT becomes less than the threshold voltage level of the transistor P11 included in the comparator 21, according to the inventive concepts, the voltage level of the pull node $N_{PULL1}$ of the buffer circuit BF including the slew-rate compensating circuit 20 and the offset blocking circuit 30 may be the same as the voltage level of the power supply voltage VDD. However, the voltage level of the pull node $N_{PULL2}$ of the buffer circuit in which the slew-rate compensating circuit 20 and the offset blocking circuit 30 are omitted may be equal to the voltage level of the threshold voltage $V_{THP}$ of the transistor P11.

According to an example embodiment according to the inventive concepts, after the input voltage VIN rises or falls, the boosting transistors N13 and P15 may be turned off by the offset blocking circuit 30. Thus, the DC offset may be removed, so that the slew rate may be improved.

Figure 16:
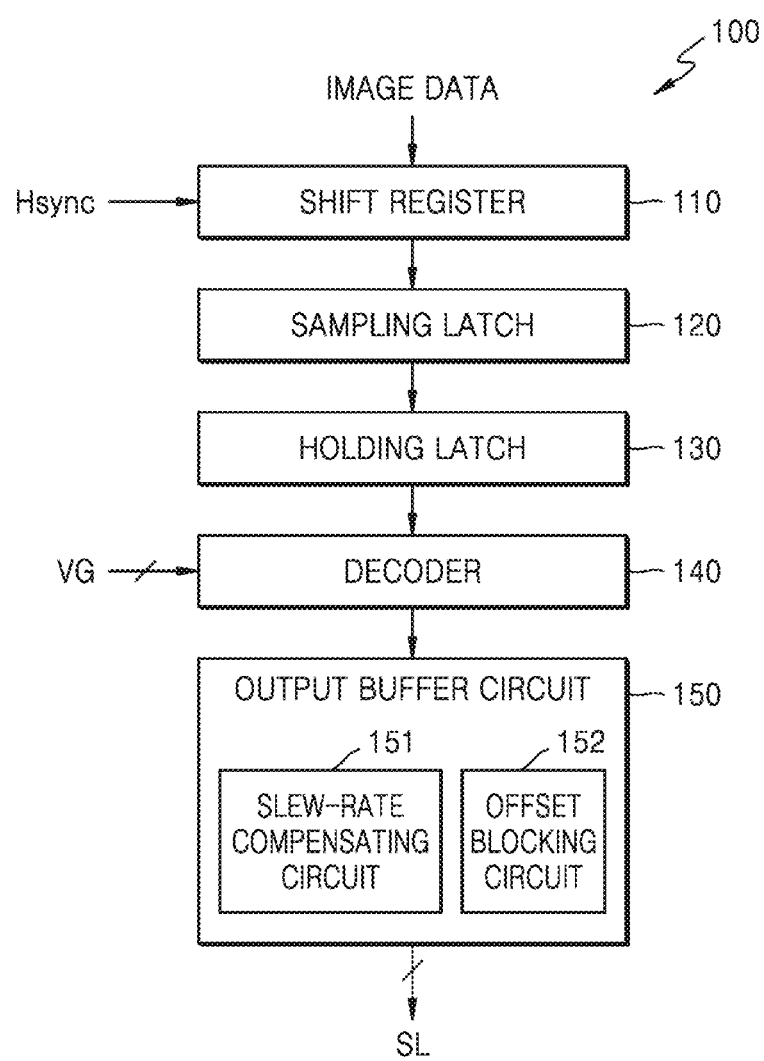
FIG. 16 is a block diagram of a source driver that includes a buffer circuit according to example embodiments of the inventive concepts.

FIG. 16 is a block diagram of a source driver including a buffer circuit according to example embodiments of the inventive concepts. In detail, FIG. 16 is a diagram for explaining a source driver including a buffer circuit BF with reference to FIGS. 1 to 14.

Referring to FIG. 16, a source driver 100 may include a shift register 110, a sampling latch 120, a holding latch 130, a decoder 140, and an output buffer circuit 150.

The shift register 110 may control an operation timing of each of the plurality of sampling circuits included in the sampling latch 120 in response to a horizontal synchronization signal Hysnc. The horizontal synchronization signal Hsync may be a signal having a constant period.

The sampling latch 120 may sample image data depending on the shift order of the shift register 110. The image data sampled by the sampling latch 120 may be stored in the holding latch 130.

The decoder 140 may include a digital-to-analog converter (DAC) and may receive a plurality of gamma voltages VG. The decoder 140 may select at least one of the plurality of gamma voltages VG based on the image data stored in the holding latch 130. The number of gamma voltages VG may be determined based on the number of bits of image data. For example, when the image data is 8-bit data, the number of gamma voltages VG may be 256 or less, and when the image data is 10-bit data, the number of gamma voltages VG may be 1024 or less.

The output buffer circuit 150 may include a plurality of output buffers implemented as an operational amplifier, and the plurality of output buffers may be connected to a plurality of source lines SL. Each of the plurality of output buffers may have a plurality of input terminals. The decoder 140 may select at least some of the gamma voltages VG based on the image data, and may provide the selected voltage to input terminals of each of the plurality of output buffers as an input voltage. Each of the plurality of output buffers may output the input voltage received from the decoder unit 140 to the source line.

Each of the plurality of output buffers may include the operational amplifier, a slew-rate compensating circuit 151, and an offset blocking circuit 152 described above with reference to FIGS. 1 to 14. Each of the plurality of output buffers includes the slew rate compensation circuit 151 and the offset blocking circuit 152, so that the DC offset may be removed, the buffer may be performed with low power, and the slew rate can be increased.

Figure 17:
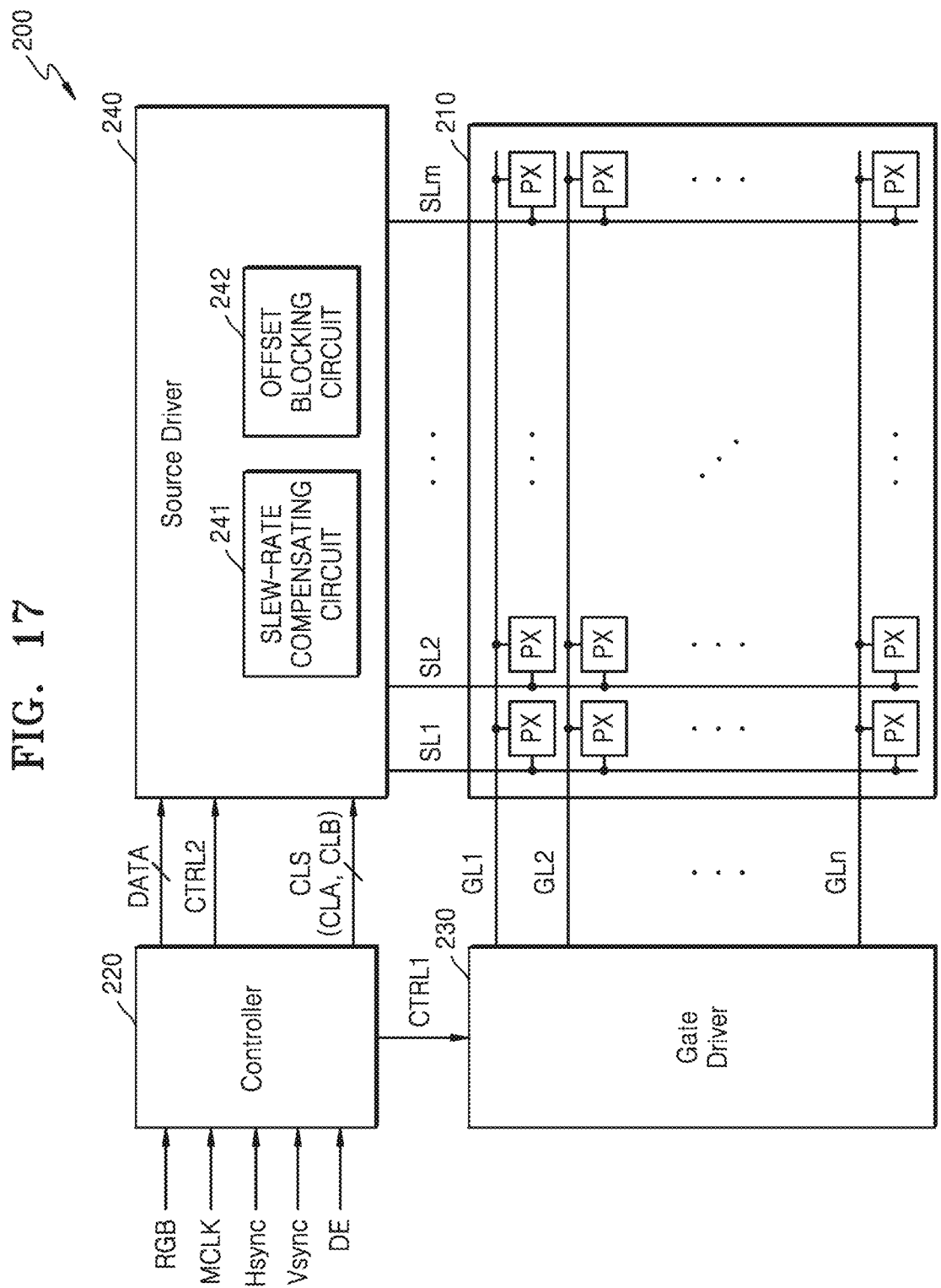
FIG. 17 is a block diagram of a display device according to example embodiments of the inventive concepts.

FIG. 17 is a block diagram of a display device according to example embodiments of the inventive concepts. In detail, FIG. 17 is a diagram for explaining the display device 200 including the source driver 100 of FIG. 16.

Referring to FIG. 17, the display device 200 may include a display panel 210, a controller 220, a gate driver 230, and a source driver 240.

The display panel 210 may include a plurality of pixels PXs arranged in a matrix form, and may display an image in units of frames. The display panel 210 may be implemented as one of a liquid crystal display (LCD), a light emitting diode (LED) display, an organic LED (OLED) display, an active-matrix OLED (AMOLED) display, a micro LED display, an electrochromic display (ECD), a digital mirror device (DMD), actuated mirror device (AMD), grating light value (GLV), plasma display panel (PDP), electro luminescent display (ELD), and vacuum fluorescent display (VFD), and may be implemented as other types of flat panel displays or flexible displays. Hereinafter, an OLED panel is described as an example, but the inventive concepts are not limited thereto.

The display panel 210 may include gate lines GL1 to GLn arranged in a row direction, source lines SL1 to SLm arranged in a column direction, and pixels PX formed at intersections of the gate lines GL1 to GLn and the source lines SL1 to SLm.

In the display panel 210, pixels PX that output red (R), green (G), and blue (B) lights may be repeatedly arranged. For example, the pixels PX may be repeatedly arranged in an R, G, B or B, G, R order. Alternatively, the pixels PX may be repeatedly arranged in the order of R, G, B, G or B, G, R, G, or the like.

The pixels PX may include a light emitting diode and a driving circuit independently driving the light emitting diode. In detail, the pixel PX may include a diode driving circuit connected to any one gate line and a source line, and a light emitting diode connected between the diode driving circuit and a power supply voltage (e.g., a ground voltage).

The diode driving circuit may include a switching element connected to the gate line, for example, a thin film transistor. When a gate-on signal is applied from the gate line and the switching element is turned on, the diode driving circuit may supply an image signal received from the source line connected to the diode driving circuit to the light emitting diode. The diode may output an optical signal corresponding to the image signal.

The controller 220 may receive a control signal from the outside. For example, the controller 220 may receive a horizontal synchronization signal Hsync, a vertical synchronization signal Vsync, a clock signal DCLK, and a data enable signal DE from the outside. The controller 220 may generate control signals CTRL1, CTRL2, and CLS for controlling the gate driver 230 and the source driver 240 based on the received control signals. Various operation timings of the gate driver 230 and the source driver 240 may be controlled depending on the control signals CNRLT1, CTRL2, and CLS.

Further, the controller 220 may receive image data RGB from the outside, process the received image data RGB, or convert the image data RGB to fit the structure of the display panel 210. The controller 220 may transmit the converted image data DATA to the source driver 240.

The controller 220 according to the example embodiment of the inventive concepts may determine the driving order of pixel groups of one horizontal line of the display panel 210. That is, the controller 220 may time-division one horizontal period to drive each of the plurality of pixel groups.

The gate driver 230 may sequentially supply a gate-on signal to the gate lines GL1 to GLn in response to the gate control signal CTRL1 received from the controller 220. For example, the gate control signal CTRL1 may include a gate start pulse GSP instructing an output start of the gate-on signal and a gate shift clock GSC controlling an output timing of the gate-on signal. When the gate start pulse GSP is applied, the gate driver 230 sequentially generates the gate-on signal (e.g., a gate voltage having a logic low level) in response to the gate shift clock GSC, and may sequentially supply the gate-on signal to the gate lines GL1 to GLn. In this case, in a period in which the gate-on signal is not supplied to the gate lines GL1 to GLn, a gate-off signal (e.g., a gate voltage having a logic high level) may be supplied to the gate lines GL1 to GLn.

The source driver 240 may convert the image data DATA into image signals (e.g., a grayscale voltage corresponding to pixel data) in response to the source control signal CTRL2 received from the controller 220, and may output the image signals through the plurality of channels CH1 to CHk. For example, the source control signal CTRL2 may include a source start signal SSP, a source shift clock SSC, a source output enable signal SOE, and the like. The source driver 240 may include a plurality of driving units that provide an image signal corresponding to one horizontal line to the source lines SL1 to SLm during one horizontal period. Each driving unit may activate source lines connected to each driving unit.

The source driver 240 may include the source driver 100 described above with reference to FIG. 16. Accordingly, the output buffer included in the source driver 240 may include a slew-rate compensating circuit 241 and an offset blocking circuit 242.

On the other hand, although not shown, the display device 200 may further include a voltage generating circuit and an interface. The voltage generating circuit may generate various voltages used in the display panel 210 and driving circuits. The interface may include, for example, one of an RGB interface, a CPU interface, a serial interface, a mobile display digital interface (MDDI), an inter integrated circuit (I2C) interface, a serial peripheral interface (SPI), a micro controller unit (MCU) interface, a mobile industry processor interface (MIPI), an embedded display port (eDP) interface, a D-subminiature (D-sub), an optical interface, and a high definition multimedia interface (HDMI). In addition, the interfaces may include various other serial or parallel interfaces.

According to the example embodiment, the controller 220 and the source driver 240 may be implemented on one semiconductor chip, and the gate driver 230 may be integrated on the display panel 210.

According to an example embodiment, the semiconductor chip may include a semiconductor substrate including single crystal silicon. Thus, the display apparatus 200 may include a driving element and/or a switch formed of a single crystal silicon thin film transistor.

According to an example embodiment, the display panel 210 may include a semiconductor substrate including amorphous Si (a-Si) or polycrystalline silicon (poly-Si). Thus, the display panel 210 may include a driving element and/or a switch composed of an amorphous silicon thin film transistor, or a driving element and/or a switch composed of a polycrystalline silicon thin film transistor.

According to an example embodiment, a pad connecting the display panel 210 to the source driver 240 may be provided. For example, the source driver 240 may include a plurality of output pads, and the display panel 210 may include a plurality of input pads.

Figure 18:
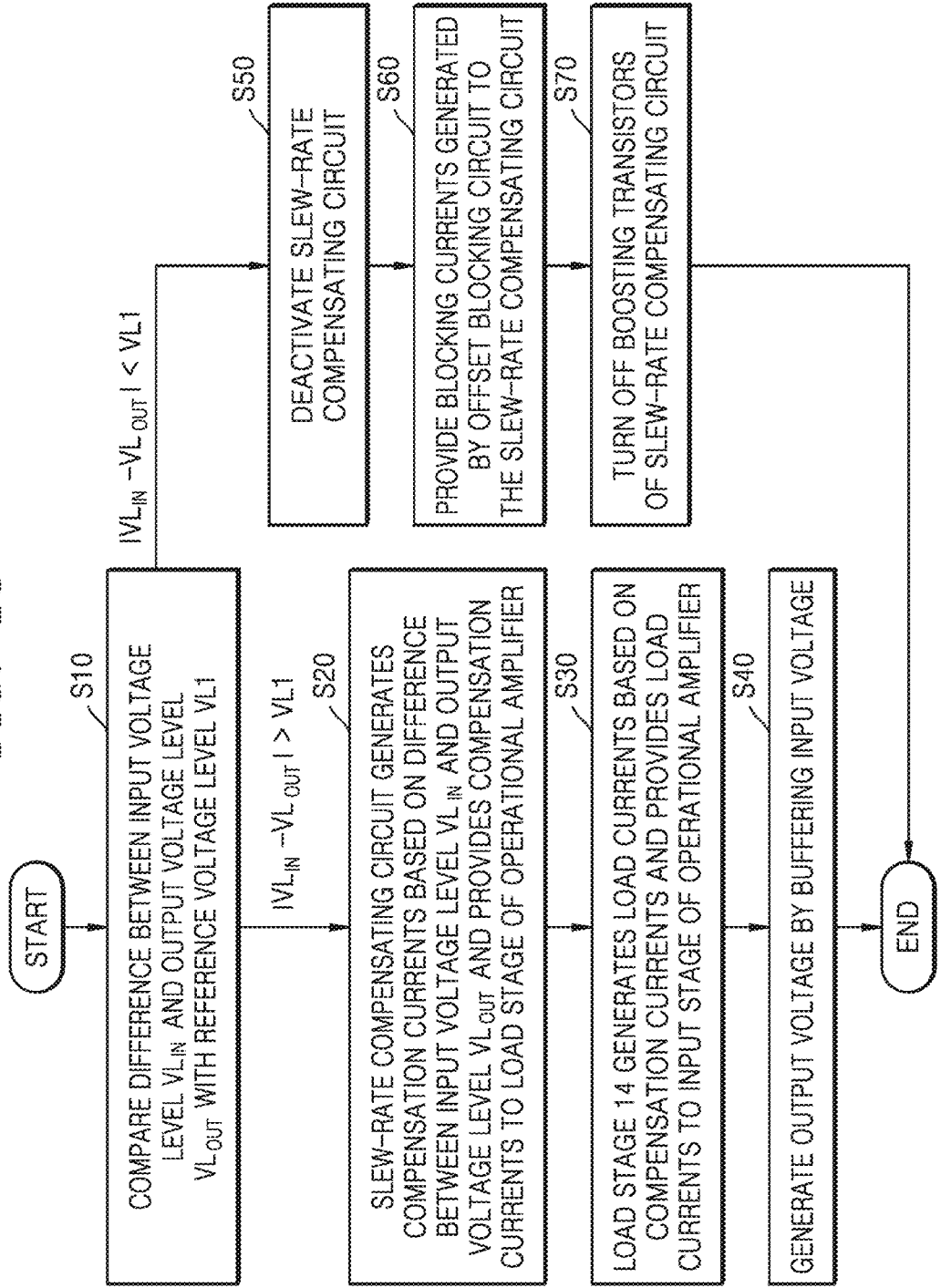
FIG. 18 is a flowchart illustrating a method of operating a buffer circuit according to example embodiments of the inventive concepts.

FIG. 18 is a flowchart illustrating a method of operating a buffer circuit according to example embodiments of the inventive concepts. In detail, FIG. 18 is a flowchart illustrating the method of operating the buffer circuit BF described above with reference to FIGS. 1 to 5. Hereinafter, it is described with reference to FIGS. 1 to 5.

Referring to FIG. 18, in step S10, a difference between an input voltage level $VL_{IN}$ and an output voltage level $VL_{OUT}$ may be compared with a reference voltage level VL1. The difference between the input voltage level $VL_{IN}$ and the output voltage level $VL_{OUT}$ may be compared in the comparison circuit 21. The reference voltage level VL1 may include threshold voltage levels of the transistors N11 and P11 including the comparison circuit 21.

In step S20, when the difference between the input voltage level $VL_{IN}$ and the output voltage level $VL_{OUT}$ is greater than the reference voltage level VL1, the slew-rate compensating circuit 20 may generate compensation currents $I_{PULL}$ and $I_{PUSH}$ based on the difference between the input voltage level $VL_{IN}$ and the output voltage level $VL_{OUT}$. For example, when the input voltage rises, the slew-rate compensating circuit 20 may generate the pull compensation current $I_{PULL}$, and when the input voltage falls, the slew-rate compensating circuit 20 may generate the push compensation current $I_{PUSH}$. The slew-rate compensating circuit 20 may provide compensation currents $I_{PULL}$ and $I_{PUSH}$ to the load stage 14 of the operational amplifier 10.

In step S30, the load stage 14 may perform a slew rate compensation operation using the compensation currents $I_{PUSH}$ and $I_{PULL}$, provided from the slew-rate compensating circuit 20. That is, the load stage 14 may generate load currents $I_{PSLI}$, $I_{PSLO}$, $I_{PLLI}$, and $I_{PLLO}$ based on the compensation currents $I_{PUSH}$ and $I_{PULL}$. The load stage 14 may provide the load currents $I_{PSLI}$, $I_{PSLO}$, $I_{PLLI}$, and $I_{PLLO}$ to the input stage 11 of the operational amplifier 10.

In step S40, the output voltage may be generated by buffering the input voltage.

In step S50, when the difference between the input voltage level $VL_{IN}$ and the output voltage level $VL_{OUT}$ is less than the reference voltage level VL1, the slew-rate compensating circuit 20 may be deactivated. Regardless of whether the slew-rate compensating circuit 20 is deactivated, the offset blocking circuit 30 may be activated by a turn-on voltage or an external bias voltage provided from the operational amplifier 10.

In step S60, the offset blocking circuit 30 may generate the blocking currents $I_{BLK\_PUSH}$ and $I_{BLK\_PULL}$ and provide the blocking currents to the slew-rate compensating circuit 20. In detail, the blocking currents $I_{BLK\_PUSH}$ and $I_{BLK\_PULL}$ may be provided to gates of the boosting transistors N13 and P15 of the slew-rate compensating circuit 20.

In step S70, the boosting transistors N13 and P15 of the slew-rate compensating circuit 20 may be turned off. Accordingly, a leakage current generated in the slew-rate compensating circuit 20 may not flow to the operational amplifier 10, and a DC offset may be removed. In addition, it is possible to provide a buffer circuit that has an increased slew rate and operates with low power.

Additionally, the display device 200 and/or the components included therein may include processing circuitry such as hardware including logic circuits; a hardware/software combination such as a processor executing software; or a combination thereof. For example, the processing circuitry may include, but is not limited to, a central processing unit (CPU), a memory controller, an arithmetic logic unit (ALU), a digital signal processor, a microcomputer, a field programmable gate array (FPGA), and programmable logic unit, a microprocessor, application-specific integrated circuit (ASIC), etc.

While the inventive concepts have been particularly shown and described with reference to example embodiments thereof, it will be understood that various changes in form and details may be made therein without departing from the spirit and scope of the following claims.

What is claimed is:

1. A buffer circuit comprising:
   an operational amplifier configured to amplify an input voltage to generate an output voltage;
   a slew-rate compensating circuit including a boosting transistor, the slew-rate compensating circuit configured to generate a compensation current based on a difference between a voltage level of the input voltage and a voltage level of the output voltage and provide the compensation current to the operational amplifier through the boosting transistor; and
   an offset blocking circuit configured to turn off the boosting transistor in response to the difference between the voltage level of the input voltage and the voltage level of the output voltage being less than a reference voltage level by providing a blocking current to a gate of the boosting transistor.

2. The buffer circuit of claim 1, wherein the offset blocking circuit is further configured to generate the blocking current based on a turn-on voltage provided from the operational amplifier or a bias voltage input from an outside.

3. The buffer circuit of claim 1, wherein the reference voltage level is a same voltage level as a voltage level of a threshold voltage of a transistor included the slew-rate compensating circuit.

4. The buffer circuit of claim 1, wherein the slew-rate compensating circuit is further configured to provide the compensation current to the operational amplifier in response to a difference between a voltage level of the input voltage and a voltage level of the output voltage being greater than the reference voltage level.

5. The buffer circuit of claim 1, wherein the slew-rate compensating circuit includes
   a comparator configured to compare a voltage level of the input voltage with a voltage level of the output voltage and generate a comparison current corresponding to a difference between the voltage level of the input voltage and the voltage level of the output voltage,
   a push compensating current circuit configured to generate a push compensation current for supplying a current to the operational amplifier by performing a current mirror operation on the comparison current, and
   a pull compensation current circuit configured to generate a pull compensation current for synchronizing a current of the operational amplifier by performing a current mirror operation on the comparison current.

6. The buffer circuit of claim 5, wherein,
in response to the difference between the voltage level of the input voltage and the voltage level of the output voltage being greater than the reference voltage level and the input voltage rising, the slew-rate compensating circuit is configured to provide the pull compensation current to the operational amplifier as the pull compensation current circuit is activated,
in response to the difference between the voltage level of the input voltage and the voltage level of the output voltage being greater than the reference voltage level and the input voltage falling, the slew-rate compensating circuit is configured to provide the push compensation current to the operational amplifier as the push compensation current circuit is activated.

7. The buffer circuit of claim 5, wherein the operation amplifier includes an input stage configured to receive the input voltage and the output voltage, the input stage including a first input terminal including a P-channel field effect transistors (PFETs) and a second input terminal including an N-channel field effect transistors (NFETs),
a load stage including a pull load circuit configured to provide a pull load current generated based on the pull compensation current to the first input terminal, a push load circuit configured to provide a push load current generated based on the push compensation current to the second input terminal, and a connection circuit connecting a pull connection node of the pull load circuit to a push connection node of the push load circuit, and
an output stage electrically connected to the pull connection node and the push connection node, and configured to buffer an output signal of the load stage to generate the output voltage.

8. The buffer circuit of claim 7, wherein
the boosting transistor is included in the push compensation current circuit and the pull compensation current circuit,
the offset blocking circuit includes
a P-channel field effect transistor (PFET) having a first gate connected to the push connection node, a first end of the first gate connected to a gate of the boosting transistor included in the push compensation current circuit, and a power supply voltage applied from a second end of the first gate; and
an N-channel field effect transistor (NFET) having a second gate connected to the pull connection node, a first end of the second gate connected to the gate of the boosting transistor included in the pull compensation current circuit, and a second end of the second gate to which a ground voltage is applied.

9. The buffer circuit of claim 5, wherein the slew-rate compensating circuit further includes
a first variable resistor having a first end of the first variable resistor connected to the pull compensation current circuit and a second end of the first variable resistor connected to the comparator, and
a second variable resistor having a first end of the variable resistor connected to the push compensation current circuit and a second end of the second variable resistor connected to the comparator.

10. A display device comprising:
a display panel including a plurality of pixels formed at intersections of gate lines arranged in a row direction and source lines arranged in a column direction;
a controller configured to generate a source control signal based on control signals received from an outside and convert image data received from an outside; and
a source driver configured to convert the image data converted by the controller into an image signal in response to the source control signal received from the controller, and provide the image signal to the source lines,
wherein the source driver includes an operational amplifier configured to amplify an input voltage to generate an output voltage;
a slew-rate compensating circuit including a boosting transistor, the slew-rate compensating circuit configured to generate a compensation current based on a difference between a voltage level of the input voltage and a voltage level of the output voltage and provide the compensation current to the operational amplifier through the boosting transistor; and
a buffer circuit including an offset blocking circuit configured to turn off the boosting transistor in response to the difference between the voltage level of the input voltage and the voltage level of the output voltage being less than a reference voltage level by providing a blocking current to a gate of the boosting transistor.

11. The display device of claim 10, wherein the offset blocking circuit is further configured to generate the blocking current, based on a turn-on voltage provided from the operational amplifier.

12. The display device of claim 10, wherein the reference voltage level is a same voltage level as a voltage level of a threshold voltage of a transistor included the slew-rate compensating circuit.

13. The display device of claim 10, wherein the slew-rate compensating circuit is further configured to provide the compensation current to the operational amplifier in response to the difference between the voltage level of the input voltage and the voltage level of the output voltage being greater than the reference voltage level.

14. The display device of claim 10, wherein the slew-rate compensating circuit includes
a comparator configured to compare a voltage level of the input voltage with a voltage level of the output voltage and generate a comparison current corresponding to a difference between the voltage level of the input voltage and the voltage level of the output voltage,
a push compensating current circuit configured to generate a push compensation current for supplying a current to the operational amplifier by performing a current mirror operation on the comparison current, and
a pull compensation current circuit configured to generate a pull compensation current for synchronizing a current of the operational amplifier by performing a current mirror operation on the comparison current.

15. The display device of claim 14, wherein,
in response to the difference between the voltage level of the input voltage and the voltage level of the output voltage being greater than the reference voltage level and the input voltage rising, the slew-rate compensating circuit is configured to provide the pull compensation current to the operational amplifier as the pull compensation current circuit is activated, and
in response to the difference between the voltage level of the input voltage and the voltage level of the output voltage being greater than the reference voltage level and the input voltage falling, the slew-rate compensating circuit is further configured to provide the push compensation current to the operational amplifier as the push compensation current circuit is activated.

16. The display device of claim 14, wherein the operation amplifier includes an input stage configured to receive the input voltage and the output voltage, including a first input terminal including a P-channel field effect transistors (PFETs) and a second input terminal including an N-channel field effect transistors (NFETs), a load stage including a pull load circuit configured to provide a pull load current generated based on the pull compensation current to the first input terminal, a push load circuit configured to provide a push load current generated based on the push compensation current to the second input terminal, and a connection circuit configured to connect a pull connection node of the pull load circuit to a push connection node of the push load circuit, and an output stage electrically connected to the pull connection node and the push connection node, and configured to buffer an output signal of the load stage to generate the output voltage.

17. A method of controlling a buffer circuit, the method comprising:

comparing a difference between an input voltage level and an output voltage level of an operational amplifier with a reference voltage level in a slew-rate compensating circuit including a boosting transistor;

generating a compensation current based on the difference between the input voltage level and the output voltage level in the slew-rate compensating circuit and providing the compensation current to the operational amplifier through the boosting transistor, in response to the difference between the input voltage level and the output voltage level being greater than the reference voltage level; and turning off a boosting transistor of the slew-rate compensating circuit by providing a blocking current, which is provided from an offset blocking circuit to the slew-rate compensating circuit, to a gate of the boosting transistor, in response to the difference between the input voltage level and the output voltage level being less than the reference voltage level.

18. The method of claim 17, wherein the turning off of the boosting transistor of the slew-rate compensating circuit includes generating, by the offset blocking circuit, the blocking current, based on a turn-on voltage provided from the operational amplifier or a bias voltage input from an outside.

19. The method of claim 17, wherein the reference voltage level is a same voltage level as a voltage level of a threshold voltage of a transistor included the slew-rate compensating circuit.

20. The method of claim 17, further comprising:

generating a push compensation current for supplying a current to the operational amplifier from among compensation currents in response to the difference between the input voltage level and the output voltage level being greater than the reference voltage level and the input voltage level rising; and synchronizing a current of the operational amplifier among the compensation currents in response to the difference between the input voltage level and the output voltage level being greater than the reference voltage level and the input voltage level falling.

* * * * *